(12) United States Patent
Cheng et al.

(10) Patent No.: US 7,812,397 B2
(45) Date of Patent: Oct. 12, 2010

(54) ULTRA THIN CHANNEL (UTC) MOSFET STRUCTURE FORMED ON BOX REGIONS HAVING DIFFERENT DEPTHS AND DIFFERENT THICKNESSES BENEATH THE UTC AND SOURCE/DRAIN REGIONS AND METHOD OF MANUFACTURE THEREOF

(75) Inventors: Changguo Cheng, Guilderland, NY (US); Dureseti Chidambarrao, Weston, CT (US); Brian Joseph Greene, Wappingers Falls, NY (US); Jack A. Mandelman, Flat Rock, NC (US); Kern Rim, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 237 days.

(21) Appl. No.: 12/166,285

(22) Filed: Jul. 1, 2008

(65) Prior Publication Data

US 2008/0283918 A1 Nov. 20, 2008

Related U.S. Application Data

(63) Continuation-in-part of application No. 11/162,959, filed on Sep. 29, 2005, now abandoned.

(51) Int. Cl.
*H01L 21/336* (2006.01)
(52) U.S. Cl. .............................. 257/347; 257/E21.411; 438/151
(58) Field of Classification Search ................. 257/347, 257/E21.444, E21.411, E21.32, E21.561; 438/151
See application file for complete search history.

(56) References Cited

U.S. PATENT DOCUMENTS

| 3,165,934 | A | 1/1965 | Bower |
| 5,510,640 | A | 4/1996 | Shindo |
| 5,891,265 | A | 4/1999 | Nakai |
| 5,930,642 | A | 7/1999 | Moore |
| 5,956,580 | A | 9/1999 | Wu |
| 6,060,749 | A | 5/2000 | Wu |
| 6,429,091 | B1 | 8/2002 | Chen |
| 6,670,278 | B2 | 12/2003 | Li et al. |

(Continued)

OTHER PUBLICATIONS

Vishal P. Trivedi et al. "Scaling Fully Depleted SOI CMOS"; IEEE Transactions on Electron Devices, vol. 50, No. 10, Oct. 2003 pp. 2095-2103.

(Continued)

*Primary Examiner*—Thao P. Le
(74) *Attorney, Agent, or Firm*—H. Daniel Schnurmann; Graham S. Jones

(57) ABSTRACT

A MOSFET structure includes a planar semiconductor substrate, a gate dielectric and a gate. A UT SOI channel extends to a first depth below the top surface of the substrate and is self-aligned to and is laterally coextensive with the gate. Source-drain regions, extend to a second depth greater than the first depth below the top surface, and are self-aligned to the UT channel region. A BOX1 region extends across the entire structure, and vertically from the second depth to a third depth below the top surface. An upper portion of a BOX2 region under the UT channel region is self-aligned to and is laterally coextensive with the gate, and extends vertically from the first depth to a third depth below the top surface, and where the third depth is greater than the second depth.

20 Claims, 13 Drawing Sheets

U.S. PATENT DOCUMENTS

| | | |
|---|---|---|
| 2005/0067294 A1 | 3/2005 | Choe |
| 2005/0112811 A1 | 5/2005 | Hsu |
| 2009/0230474 A1* | 9/2009 | Clark et al. ................. 257/350 |
| 2009/0242936 A1* | 10/2009 | Cheng et al. ................. 257/190 |
| 2009/0250755 A1* | 10/2009 | Ohmi et al. ................. 257/347 |
| 2009/0267149 A1* | 10/2009 | Hua et al. ................... 257/347 |
| 2009/0278201 A1* | 11/2009 | Chatty et al. ............... 257/347 |
| 2009/0302354 A1* | 12/2009 | Chuang et al. .............. 257/206 |

OTHER PUBLICATIONS

Vishal P. Trivedi et al. "Nanoscale FD/SOI CMOS: Thick or Thin BOX?"; IEEE Electron Device Letters, vol. 26, No. 1, Jan. 2005 pp. 26-28.

* cited by examiner

ULTRA THIN CHANNEL (UTC) MOSFET STRUCTURE FORMED ON BOX REGIONS HAVING DIFFERENT DEPTHS AND DIFFERENT THICKNESSES BENEATH THE UTC AND SOURCE/DRAIN REGIONS AND METHOD OF MANUFACTURE THEREOF

This application is a continuation-in-part of copending U.S. patent application Ser. No. 11/162,959, filed 29 Sep. 2005 entitled "Planar Ultra-Thin Semiconductor-On-Insulator Channel MOSFET with Embedded Source/Drain."

BACKGROUND OF THE INVENTION

This invention relates to Ultra Thin (UT) Metal Oxide FET (MOSFET) devices. While the embodiment comprises a MOSFET device, as indicated by the title, the present invention can be embodied in Metal Insulator FET (MISFET) devices which employ gate dielectrics other than oxides. The term Ultra Thin (UT), as employed herein refers to Ultra Thin Channel (UTC) regions in SEMiconductor-On-Insulator (SEMOI) FET devices with the source and drain regions formed in thicker SEMOI or Silicon-On-Insulator (SOI) regions of a semiconductor substrate aside from the UTC regions. As employed herein the term SEMiconductor-On-Insulator (SEMOI) is a generic term which refers generally to structures of a semiconductor layer formed on an insulator such SOI, Silicon-Germanium-On-Insulator (SGOI), and Germanium-On-Insulator (GOI) structures. In SEMOI structures, in addition to SOI (silicon) and GOI (germanium) the semiconductor layer on top of the BOX layer may comprise other semiconductor materials such as silicon carbide, III-V compound semiconductors, and II-VI compound semiconductors.

There is a problem of fringing with a uniformly thick BOX layer extending under the channel. with a uniformly thin BOX layer, there will be fringing that will go through the BOX layer down into the substrate below the BOX layer, but when the BOX is thick, fringing goes over into the channel which is explained in an article by as stated at page 2096 Trivedi et al entitled "Scaling Fully Depleted SOI CMOS" IEEE Transactions on Electron Devices, VOL. 50, NO. 10, (October 2003), pp. 2095-2103. In addition thin BOX is undesirable in SOI CMOS devices because of electric field fringing in the BOX as described by V. P. Trivedi, et al entitled "Nanoscale FD/SOI CMOS: Thick or Thin BOX?" IEEE Electron Device Letters, Vol. 26, No. 1, (January 2005) pp. 26-28. Another problem with thin uniform BOX structures in CMOS devices is that the CMOS speed is reduced as stated by Trivedi in the above cited article. Still another problem is encountered, particularly with semiconductor devices with Raised Source/Drain (RSD) and Ultra-Thin Channel (UTC) semiconductor-on-insulator devices, which is the requirement for low raised source-drain for resistance forces the stressed liners to be located farther away from the channel than would be desired by the designer. For example a UTC SOI device with an RSD of 30 nm (including silicide) encounters a significant stress loss in the channel. The loss of performance due to the inefficient transfer of stress to the channel is compounded by the competing need to use sidewall insulating spacers which are as thick as possible, to minimize gate to source-drain capacitance. The present invention addresses these problems caused by loss of stress transferred to the channel of UTC SOI MOSFET devices. There is another problem which is that dislocations in a silicon substrate are caused by oxygen ion implanted into that silicon substrate. Referring to Nakai et al. U.S. Pat. No. 5,891,265 entitled "SOI Substrate Having Monocrystal Silicon Layer on Insulating Film", the Abstract states as follows: "Oxygen ion is implanted into a silicon substrate to remain a silicon layer on a surface of the silicon substrate. In this state, a silicon oxide layer is formed under the silicon layer. Silicon oxide particles are formed and remained in the residual silicon layer. While maintaining this state, the silicon substrate is heated to a predetermined temperature not less than 1300° C. Alternatively, the silicon substrate is heated at a high temperature-rise rate to 900-1100° C., and thereafter is heated at a low temperature-rise rate to the temperature not less than 1300° C. The silicon substrate is held at the predetermined temperature not less than 1300° C. for a predetermined time, whereby crystallinity of the residual silicon layer is restored. A pinning effect of the silicon oxide particles prevents the rise of dislocation to the surface of the SOI layer, and also suppresses a rate per a unit time at which interstitial silicon generates during the heating to the high temperature region. Therefore, a dislocation density of the SOI layer can be reduced." At Col 4, lines 6-18 Nakai states as follows: "In the manufacturing method according to the aspect of the invention, the silicon substrate is heated while remaining the silicon oxide particles in the silicon surface layer. Therefore, the silicon oxide particles formed and remaining in the silicon surface layer prevent dislocation from rising to and extending in a surface of the silicon surface layer by their pinning effect. This can prevent the dislocation from rising to the surface of the SOI layer (monocrystal silicon layer). Owing to the pinning effect described above, the existence of the silicon oxide particles prevents multiplication of the dislocation and stabilizes the same. Thereby, the dislocation density of the SOI layer can be remarkably reduced."

Hsu et al. U.S. Published Patent Application 2005/0112811 for "Ultra-Thin SOI MOSFET Method and Structure" describes a raised source-drain UTSOI channel MOSFET. The embodiment of Hsu et al. is an example of the above described problem that it has high gate to source-drain capacitance and poor stress transfer to the channel. The lower surface of the UTSOI under channel is coplanar with the lower surface of the source-drain regions, as there is only a single BOX layer of uniform thickness. The source-drain regions are thicker than the channel, but are elevated. However, we have found that it would be preferred that they be recessed rather than elevated.

Wu U.S. Pat. No. 6,060,749 entitled "Ultra-Short Channel Elevated S/D MOSFETS formed on an Ultra-Thin SOI Substrate" and Wu, U.S. Pat. No. 5,956,580 entitled "Method to Form Ultra-Short Channel Elevated S/D MOSFETS on an Ultra-Thin SOI Substrate" describe a UTSOI MOSFET with thicker source-drain regions, but the thicker source-drain regions are elevated above the surface of the channel. To avoid high gate to source-drain capacitance very thick sidewall spacers are used, which results in very poor stress transfer if an overlying stress liner is used.

Choe U.S. Published Patent Application 2005/0067294 entitled "SOI by Oxidation of Porous Silicon" teaches methods of forming an SOI substrate using the porous silicon techniques including ion implantation of a p-type dopant, anodization, and oxidation as is well known in the art. The dopant is selected from the group consisting of p-type dopants such as Ga, Al, B and $BF_2$, with B and $BF_2$ being preferred. The resultant structure contains a blanket buried insulator, and another patterned layer of BOX.

Chen et al U.S. Pat. No. 6,429,091 entitled "Patterned Buried Insulator" a patterned buried insulator layers are formed below the future location of the source and drain regions by forming a mask over the body area and implanting a dose of n or p type ions to form buried doped layers. The dopant is implanted to make the silicon easier to etch. Then STI apertures intersecting the buried doped layers are formed by etching. The material which had formed in buried regions, when they were implanted, is then removed by etching through the STI apertures. A light oxidation is followed by a conformal oxide deposition into the STI apertures and also into the buried etched regions, thereby forming BOX regions alongside the STI apertures. Chen et al. does not teach the use of porous silicon to form BOX regions. Furthermore, Chen does not form the UTSOI region under the gate. The semiconductor under the gate is bulk and therefore suffers from the short channel scaling problems that our UTSOI structure solves. Chen does provide source-drain regions which are insulated from the substrate for reduced junction capacitance.

SUMMARY OF THE INVENTION

It is an object of this invention to form a merging of adjacent layers or patterned layers of Buried OXide (BOX) regions.

It is another object of this invention to provide a structure or method for providing self-aligned BOX regions for any features, including features above the substrate This invention provides a structure for MOSFET devices and a method for fabricating that structure of MOSFET devices such as UT SOI devices having embedded thick source-drain regions.

This invention provides a structure and method for fabricating a UTC SOI MOSFET having embedded thick source-drain regions. The method employs the selective formation of porous silicon regions in a monocrystalline silicon substrate. The porous silicon regions are then converted to silicon oxide, which defines a complex geometry BOX structure. The BOX structure enables embedded thick source-drain structures, resulting in increased channel strain and higher performance, along with an UTC silicon layer in a semiconductor-on-insulator structure in which the channel is formed for suppression of deleterious short channel effects. The embedded thick source-drain regions provide reduced series resistance, eliminating the need for a Raised Source-Drain (RSD) structure. This allows the use of thinner gate sidewall spacers without incurring a penalty in gate to source-drain capacitance. The use of thinner gate sidewall spacers allows higher stress to be transferred to the channel, resulting in higher performance.

Other advantages of the structure, that are more apparent in the detailed embodiment include:

The source-drain regions are self-aligned with the gate conductor and vice versa.

The self-alignment eliminates variations in channel strain due to alignment tolerances between the Gate Conductor (GC) mask level and the RX mask level. The RX mask is used to define where transistors are to be formed. The GC mask is employed to define the location of the gate conductors. Note that when reference is made to the tolerance between GC and RX levels, reference is being made as to how precisely the gate conductor (GC) aligns to the edges of the regions containing the transistors (semiconductor-on-insulator body+ source/drain regions.)

Furthermore, gate to diffusion overlap can now be minimized, resulting in reduced overlap capacitance and higher performance.

The embedded source-drain regions can now be placed much closer to the gate edge, resulting in reduced extrinsic source-drain resistance and higher performance.

The method uses a replacement gate process, which allows the use of a high-K/Metal gate dielectric for improved device scaling and reduced gate leakage.

In accordance with this invention, a semiconductor substrate with a stack of a gate dielectric layer and a gate conductor is formed on a top surface of the substrate. A SEMiconductor-On-Insulator (SEMOI) channel region extends to a first depth (D1) below the top surface, with and Ultra Thin Channel (UTC) region being self-aligned with and being laterally coextensive with the gate conductor. Source-drain regions are juxtaposed with the UTC region formed in the SEMOI substrate. The source-drain regions extend to a second depth (D2) below the top surface, and the D2 is greater than D1. Preferably, a first Buried OXide (BOX) region formed in the substrate extends laterally across the structure, and vertically from the D2 to a third depth (D3) below the top surface of the substrate, and D3 is greater than D2. An upper portion of a second BOX region formed in the substrate is positioned under the UTC region and is self-aligned with and is laterally coextensive with the gate conductor, and extends vertically from D1 to a fourth depth (D4) below the top surface of the substrate. A lower portion of a second BOX region under the source-drain regions is self-aligned to the gate conductor, and extends vertically from a fifth depth (D5) to a sixth depth (D6) below the top surface of the substrate, and where the D5 is less than D4, and where the D5 and D6 are both greater than D4. The UTC region is formed in the surface of the substrate; the source-drain regions extend deeper than UTC region and are self aligned to the gate conductor. In addition; the top surface of the SEMOI semiconductor layer is substantially coplanar with upper surfaces of the UTC region and the source/drain regions. The thickness of BOX1 layer plus the BOX2 layer under UTC region and the gate conductor is thinner, than the thickness of the BOX1 layer plus the BOX2 layer under the source/drain regions. In addition the BOX1 and BOX2 regions are preferably boron implanted and anodized ITOX (InTernal OXide) regions. The boron implanted and anodized ITOX regions comprise structures, the characteristic of which are detectable with test equipment.

Further in accordance with this invention, an SEMOI FET device comprises an FET device with a gate dielectric and a gate conductor formed on a semiconductor substrate above BOX regions of different depths and thicknesses. A first Buried Oxide (BOX) region is formed in the semiconductor substrate defining a lower surface of the source and drain regions of the SEMOI FET device. An upper, second BOX region is formed in the substrate directly below the gate electrode and UTC region and aligned with the gate conductor. The upper, second BOX region extends above the first BOX region but a portion thereof reaches down into the first BOX region. Thus, the UTC is formed in a thin upper layer of the semiconductor substrate above the upper, second BOX region.

In accordance with another aspect of this invention, an FET device is formed upon a semiconductor substrate which has a surface. The FET device is formed in and upon the surface of the semiconductor substrate. A gate dielectric and a gate conductor are formed above the surface of the semiconductor substrate. The UTC region is formed in a thin upper layer of the semiconductor substrate. A first Buried Oxide (BOX) region is formed in the semiconductor substrate below the surface defining a lower surface of the source and drain regions of the FET defining an upper layer of the semiconductor substrate. An upper, second BOX region is formed in the semiconductor substrate below the gate electrode and the UTC region and aligned with the gate conductor. The upper, second BOX region extends above the first BOX region. Preferably, source regions and drain regions are located aside from the gate conductor and the UTC channel. Preferably, the source regions and drain regions, which are embedded in the thin upper layer of the semiconductor substrate above the first BOX region; are self-aligned with the UTC region and the gate conductor. Source regions and drain regions are embedded in the thin upper layer of the semiconductor substrate; and the source regions and the drain regions are self-aligned with the gate conductor. Preferably, a surface layer of semiconductor oxide or other suitable insulator is formed on the surface of the thin upper layer of the semiconductor substrate aside from the gate electrode. Preferably, source/drain extensions are formed beneath the surface layer of semiconductor oxide or other suitable insulator aside from the gate dielectric. Preferably, a surface layer of semiconductor oxide or other suitable insulator is formed on the surface of the thin upper layer of the semiconductor substrate aside from the gate electrode. Source/drain extensions are formed beneath the surface layer of semiconductor oxide or other suitable insulator aside from the gate dielectric; and the source/drain regions are formed beneath the surface layer of semiconductor oxide or other suitable insulator. Preferably, the UTC region is formed in the thin upper layer of the semiconductor substrate above the first BOX region. A surface layer of semiconductor oxide or other suitable insulator is formed on the surface of the thin upper layer of the semiconductor substrate aside from the gate electrode above the first BOX region. Source/drain extensions are formed in the thin upper layer of the semiconductor substrate beneath the surface layer of semiconductor oxide or other suitable insulator aside from the gate dielectric and source regions and drain regions are embedded in the thin upper layer of the semiconductor substrate beneath the surface layer of semiconductor oxide or other suitable insulator. The source regions and the drain regions are self-aligned with the gate conductor.

In accordance with still another aspect of this invention, a MOSFET device is formed upon a silicon semiconductor substrate having a surface. An FET device formed in a space in the surface of the silicon semiconductor substrate with a gate dielectric, a gate conductor and a UTC region formed in the semiconductor substrate. A first Buried Oxide (BOX) region formed in the silicon semiconductor substrate below the surface defining a lower surface of a thin upper layer of the silicon semiconductor substrate. An upper, second BOX region is formed below the gate electrode and the UTC region and is aligned with the gate conductor. A lower, second BOX region is formed below the first BOX region aside from the upper, second BOX region and the gate electrode. The upper, second BOX region extends above the first BOX region.

Preferably, the UTC region extends beneath the gate electrode to sidewalls of the upper, second BOX region. Preferably, the UTC region is formed in the thin upper layer of the silicon semiconductor substrate above the first BOX region. Preferably, source regions and drain regions are self-aligned with the gate conductor. Preferably, source regions and drain regions are embedded in the thin upper layer of the silicon semiconductor substrate above the first BOX region; and the source regions and drain regions are self-aligned with the gate conductor. Preferably, the UTC region is formed in the thin upper layer of the silicon semiconductor substrate above the first BOX region. Source regions and drain regions are embedded in the thin upper layer of the silicon semiconductor substrate; and the source regions and the drain regions are self-aligned with the gate conductor. Preferably, a surface layer of silicon oxide or other suitable insulator is formed on the surface of the thin upper layer of the silicon semiconductor substrate aside from the gate electrode. Preferably, source/drain extensions are formed beneath the surface layer of silicon oxide or other suitable insulator aside from the gate dielectric. Preferably, the UTC region is formed in the thin upper layer of the silicon semiconductor substrate above the first BOX region. A surface layer of silicon oxide or other suitable insulator is formed on the surface of the thin upper layer of the silicon semiconductor substrate aside from the gate electrode above the first BOX region. Source/drain extensions are formed in the thin upper layer of the silicon semiconductor substrate beneath the surface layer of silicon oxide or other suitable insulator aside from the gate dielectric; the source regions and drain regions are embedded in the thin upper layer of the silicon semiconductor substrate beneath the surface layer of silicon oxide or other suitable insulator; and the source regions and the drain regions are self-aligned with the gate conductor.

In accordance with still another aspect of this invention, a method of forming a semiconductor-on-insulator MOSFET device is as follows. Form a gate electrode stack comprising a gate dielectric layer and a gate conductor on a top surface of a semiconductor substrate. Form a first Buried OXide (BOX) region in the substrate below the surface defining a thin upper semiconductor-on-insulator layer of the semiconductor substrate between the surface and the first BOX region. Form an upper, second, BOX region in the semiconductor-on-insulator layer of the semiconductor substrate below both the gate conductor and the UTC region, the upper, second BOX region being aligned with the gate conductor with the upper, second BOX region extending above the first BOX region to form an Ultra Thin (UT) semiconductor layer thereabove in the semiconductor-on-insulator layer. Form a UTC region in the UT layer of the semiconductor substrate above the upper, second, BOX region. Preferably, the BOX regions are formed by the steps comprising implanting dopant into the semiconductor substrate to form doped regions; then forming porous regions in the semiconductor substrate from the doped regions; and converting the porous regions into BOX regions. Preferably, the method includes forming a sacrificial layer; and patterning the sacrificial layer into a dummy gate electrode; forming a gate patterning mask over the dummy gate electrode; then planarizing the gate patterning mask to expose the dummy gate electrode; then etching away the dummy gate electrode to form a gate conductor aperture in the gate patterning mask. Preferably, the semiconductor substrate comprises a silicon semiconductor substrate; a gate dielectric is formed in the gate conductor aperture; and a gate conductor is formed on the gate dielectric in the gate conductor aperture. Preferably, strip the gate patterning mask; then form sidewall spacers on sidewalls of the gate conductor; and form source/drain regions in the semiconductor-on-insulator layer aside from the UTC region extending deeper into the SOI layer than the UTC region aside from the upper, second BOX region.

BRIEF DESCRIPTION OF THE DRAWINGS

The foregoing and other aspects and advantages of this invention are explained and described below with reference to the accompanying drawings, in which.

The invention and objects and features thereof will be more readily apparent from the following detailed description and appended claims when taken with the drawings.

DESCRIPTION OF THE PREFERRED EMBODIMENT

The method of this invention provides for fabrication of a UT or a UT semiconductor-on-insulator MOSFET with high-K/metal self-aligned replacement gate and embedded source/drains using oxidized porous silicon, described below with reference to the FIGS. 1A-1W, 2 and 3.

UTC SEMOI MOSFET Embodiment and a Method of Formation Thereof

Figure 1A:
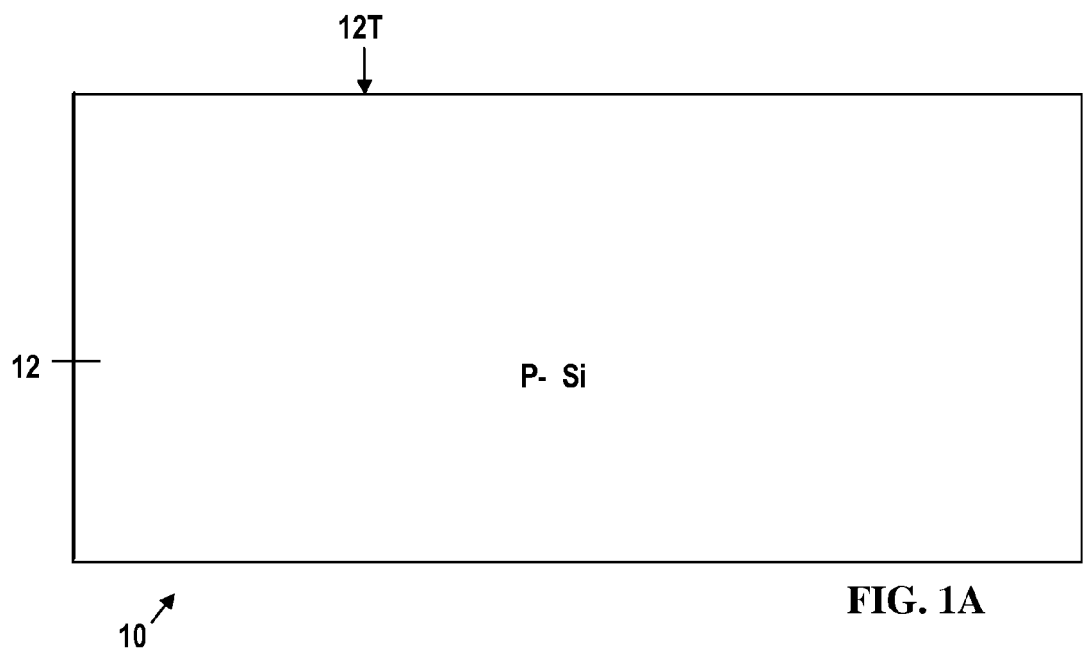
FIGS. 1A-1W show a method of forming a first embodiment of a UT MOSFET or a UT semiconductor-on-insulator MOSFET with high-K/Metal self-aligned replacement gate and embedded source/drains using oxidized porous silicon, in accordance with the method of this invention with a first BOX1 region which defines a semiconductor-on-insulator structure and a second set of BOX2 regions. The upper portion of the second set of BOX regions defines the lower surface of the UTC region which comprises a UT layer in the semiconductor-on-insulator layer and the first BOX1 region defining the depths of the S/D regions which reach substantially below the depth of the UTC region. The resulting device is shown in FIG. 1W.
Figure 3:
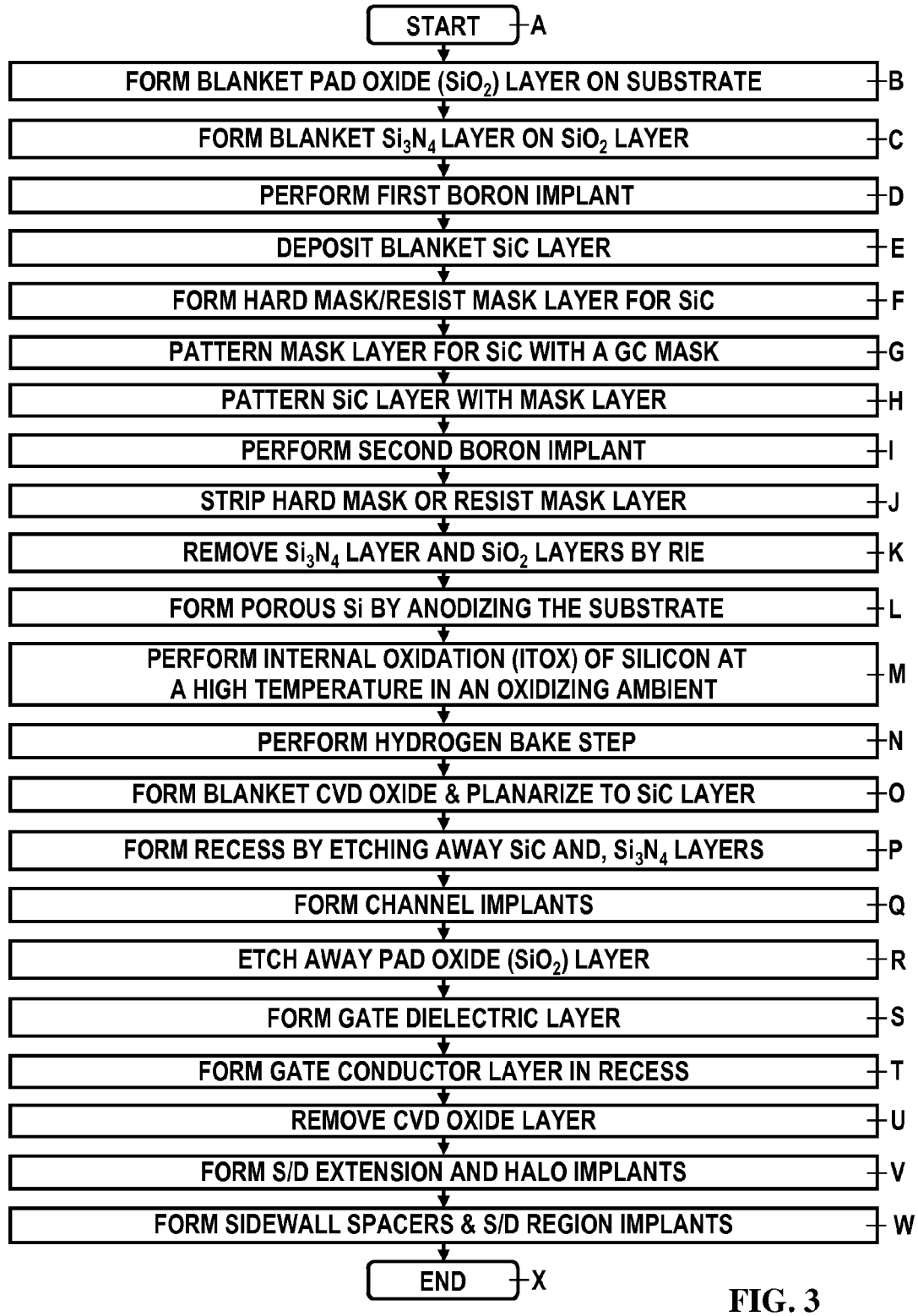
FIG. 3 is a flowchart of showing a sequence of steps A to W of FIGS. 1A to 1W in accordance with the method of this invention.

FIG. 1A shows a sectional view of a device 10 in accordance with this invention in an early stage of fabrication of a UTC SEMOI MOSFET starting in accordance with step A of FIG. 3. The method begins preferably with a bulk substrate 12 which is to be the substrate upon which a SEMOI structure is to be formed. An insulator in the form of a Buried OXide (BOX) layer will be formed on or in the bulk substrate 12 at some point in the process. The SEMOI structure will be a semiconductor layer formed on an insulator which is formed on the bulk substrate 12. Heretofore the most commonly used SEMOI structures have employed Silicon (Si) as the semiconductor in a Silicon-on-Insulator (SOI) structure. Alternatively they have employed Silicon-Germanium (SiGe) in a Silicon-Germanium-On-Insulator (SGOI) structure or Germanium (Ge) in a Germanium-On-Insulator (GOI) structure. As indicated above SEMOI structures may comprise an SOI or a GOI SEMOI layer formed on top of a BOX layer or layers. Alternatively the semiconductor layer atop a BOX layer of this invention may comprise other semiconductor materials such as silicon carbide, III-V compound semiconductors, and II-VI compound semiconductors, conventional bulk semiconductor material selected from group IV periodic table elements and compound semiconductors from groups III-V and II-VI. For example Si, Ge, SiGe, (mentioned above) and silicon-carbide (SiC) are group IV periodic table elements which may be employed. Compound semiconductors from groups III-V and II-VI include such materials as Gallium Arsenide (GaAs), Indium Phosphide (InP), and Aluminum Gallium Arsenide (AlGaAs).

The semiconductor substrate 12 may comprise a thick portion under all the BOX regions of a first semiconductor.

Preferably the substrate can be formed as a laminated structure by epitaxial growth of an upper, second semiconductor region on a substrate composed of a first semiconductor region 12. That is to say that one starts with a laminated semiconductor substrate which does not initially contain a BOX layer, but which involves a lamination of two materials by epitaxial deposition. Generally, low defect epitaxial growth of a semiconductor layer would limit the substrate and grown layer to being semiconductors from the same periodic table group. For example a first semiconductor layer 12 composed of silicon can be coated with second semiconductor layer 16 composed of SiGe. Alternatively, a first semiconductor layer 12 composed of SiGe can be coated with a second semiconductor layer 16 composed of silicon. Other options are a Si layer on a SiGe substrate 12; a SiC layer on a Si substrate 12; a Ge layer on a Si substrate 12; a GaAlAs layer on a Si substrate 12; or a GaAs layer on a Si substrate 12.

Preferably the semiconductor substrate 12 is composed of silicon because of the convenience of working with silicon and the facility of forming porous/oxidized semiconductor regions in accordance with the method of this invention. In the case that substrate 12 is composed of silicon, it is preferred that the silicon is lightly doped (e.g. $1 \times 10^{15}$ cm$^{-3}$-$1 \times 10^{18}$ cm$^{-3}$) with n-type or p-type dopant. Alternatively, the substrate 12 can be replaced with an SOI substrate. The substrate 12 has a top surface 12T.

Formation of Pad Oxide and Nitride Layers

Figure 1B:
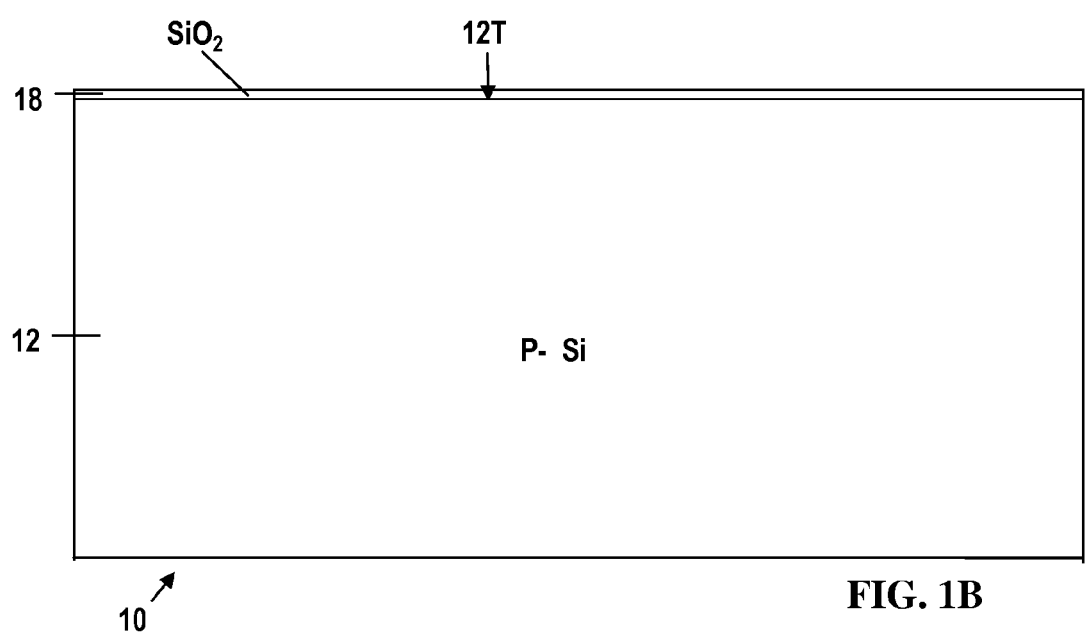

FIG. 1B shows the device 10 of FIG. 1A after formation in accordance with step B of FIG. 3 of a blanket thin pad oxide (SiO$_2$) layer 18 with a thickness of about 1 nm-5 nm on the top surface 12T of the bare semiconductor substrate 12 which may be composed of silicon (Si). Conventional means may be used to form the thin pad oxide layer 18, such as thermal oxidation.

Figure 1C:
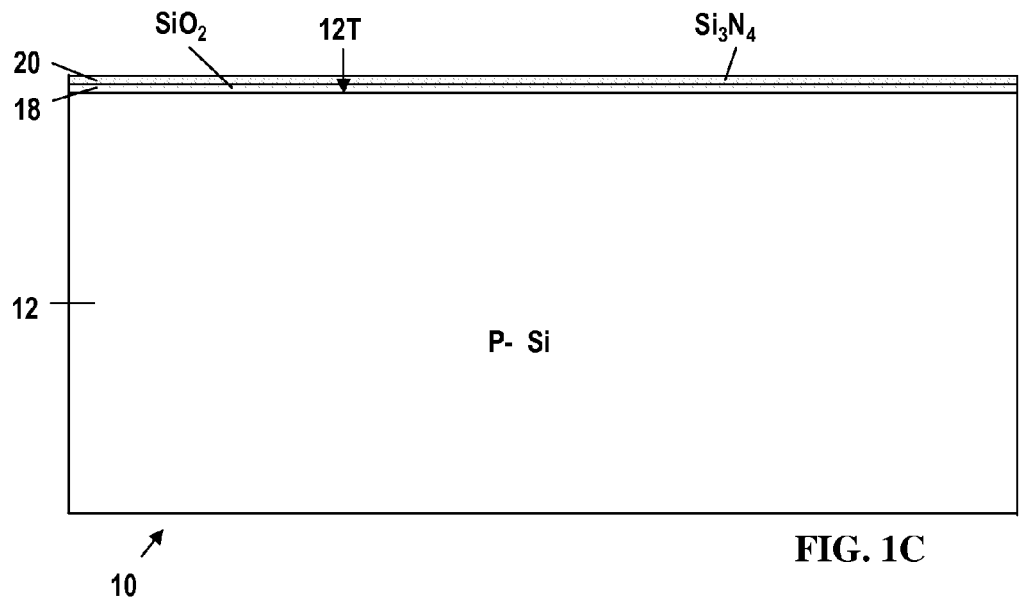

FIG. 1C shows the device 10 of FIG. 1B following formation in accordance with step C of FIG. 3 of a blanket silicon nitride (Si$_3$N$_4$) layer 20 with a thickness of about 1 nm-5 nm on the thin pad oxide layer 18. Conventional means may be used to form the silicon nitride layer 20, such as a CVD nitride process.

Initial Implantation of Boron Dopant Ions

Figure 1D:
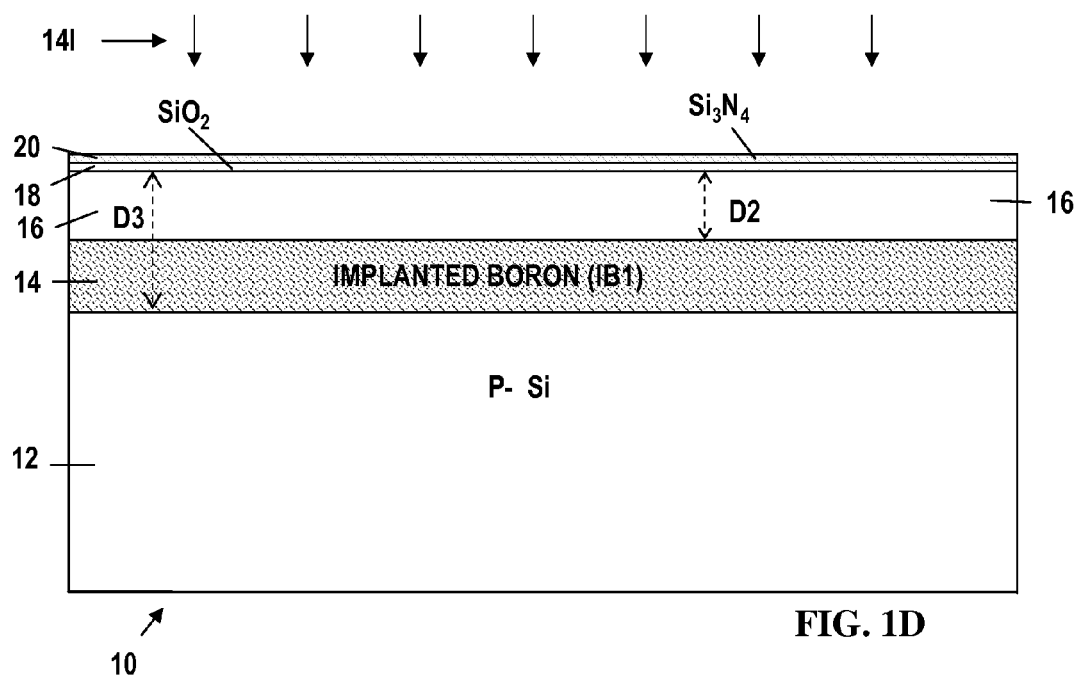

FIG. 1D shows the device 10 of FIG. 1C during implanting in accordance with step D of FIG. 3 forming a buried implanted IB1 region 14 in the substrate 12. The buried IB1 region 14 is doped with boron dopant ions 141 in accordance with step 33 of FIG. 3. The buried IB1 region 14 has a peak concentration of dopant in the range from about $1 \times 10^{19}$ cm$^{-3}$ to about $5 \times 10^{20}$ cm$^{-3}$, although concentrations less than or greater than the above mentioned range may be used. Since the depth of the upper edge of the buried IB1 region 14 will determine the depth of the embedded source-drain regions (S/D) shown in FIG. 1T, the energy of the implant should be adjusted accordingly. Optionally, a block mask can be used to confine the implant to selected regions of the substrate. A thin semiconductor (Si) region 16 of the semiconductor (Si) substrate 12 remains in the surface of the semiconductor (Si) substrate 12 above the buried IB1 region 14. Referring briefly to FIG. 1M which shows the device 10 in a much later stage in the process of manufacture after performance of step M in FIG. 3, so that at that stage the thin semiconductor (Si) region 16 will be transformed into the semiconductor of a SOI structure above the insulation layer formed by BOX1 region 214. Preferably the upper edge (top surface) of the buried IB1 region 14 is located a depth D2 (about 50 nm to 300 nm) beneath the top surface 12T of the thin silicon region 16 of the silicon substrate 12. The lower edge (bottom surface) of the buried IB1 region 14 is a depth D3 below the top surface of the thin semiconductor region 16 of the semiconductor substrate 12. (Note that the depth D1, which is less in length than the depth D2 is shown in FIG. 1I as the depth of a buried IB1 region below the top surface of the thin semiconductor region 16 as described below with reference to FIG. 1I.) The lower edge (bottom surface) of the buried IB1 region 14 is a depth D3 below the top surface of the thin semiconductor region 16 of the semiconductor substrate 12. The buried IB1 region 14 is positioned an intermediate depth between the depth D2 and the depth D3 below the top surface of the thin semiconductor region 16.

Formation of Blanket Sacrificial SiC Layer

Figure 1E:
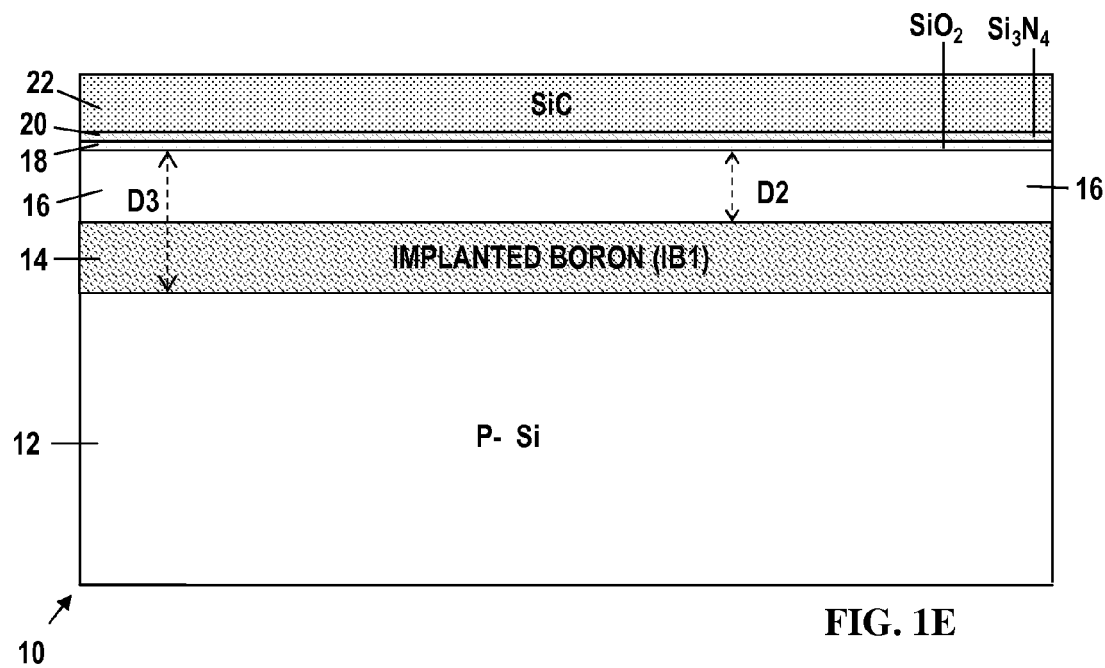

FIG. 1E shows the device 10 of FIG. 1D after deposition in accordance with step E of FIG. 3 of a blanket sacrificial layer 22 of a silicon carbide (SiC). The thickness of the SiC layer 22 is preferably between 30 nm and 300 nm.

Formation and Patterning of Blanket Hard Mask Layer

Figure 1F:
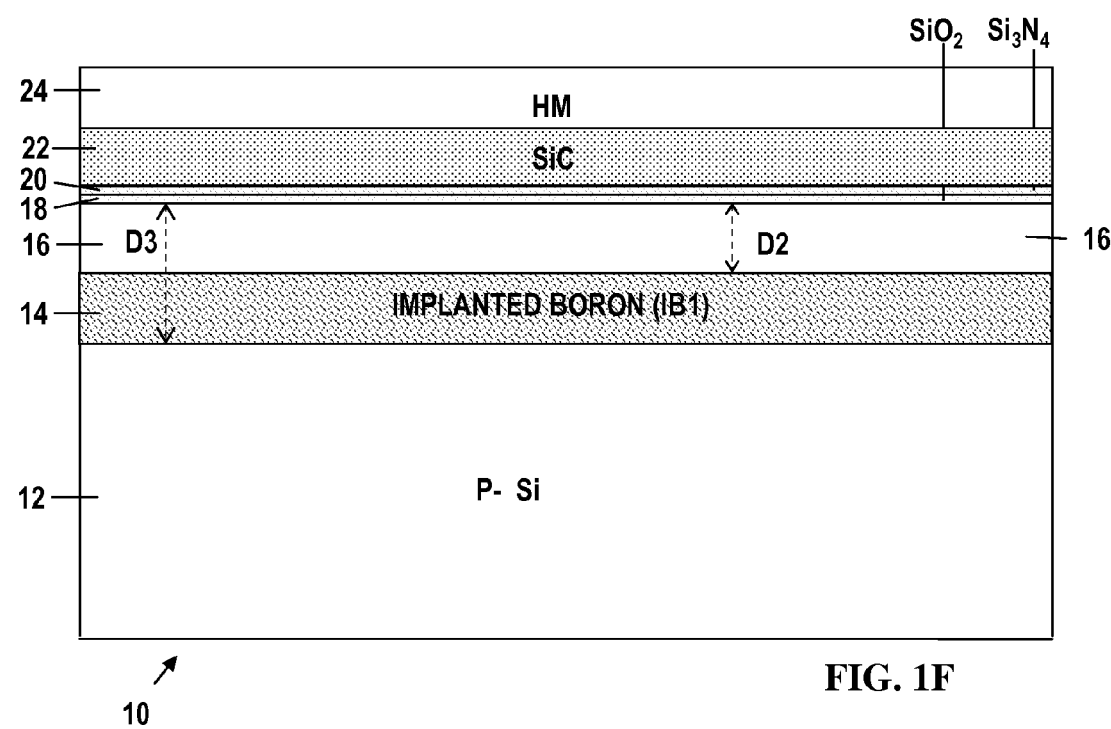

FIG. 1F shows the device 10 of FIG. 1E after step F of FIG. 3 in which a hard mask layer 24 (e.g. silicon dioxide, silicon nitride) is deposited over the sacrificial layer 22. The hard mask layer 24 preferably has a thickness from about 50 nm to about 300 nm.

Figure 1G:
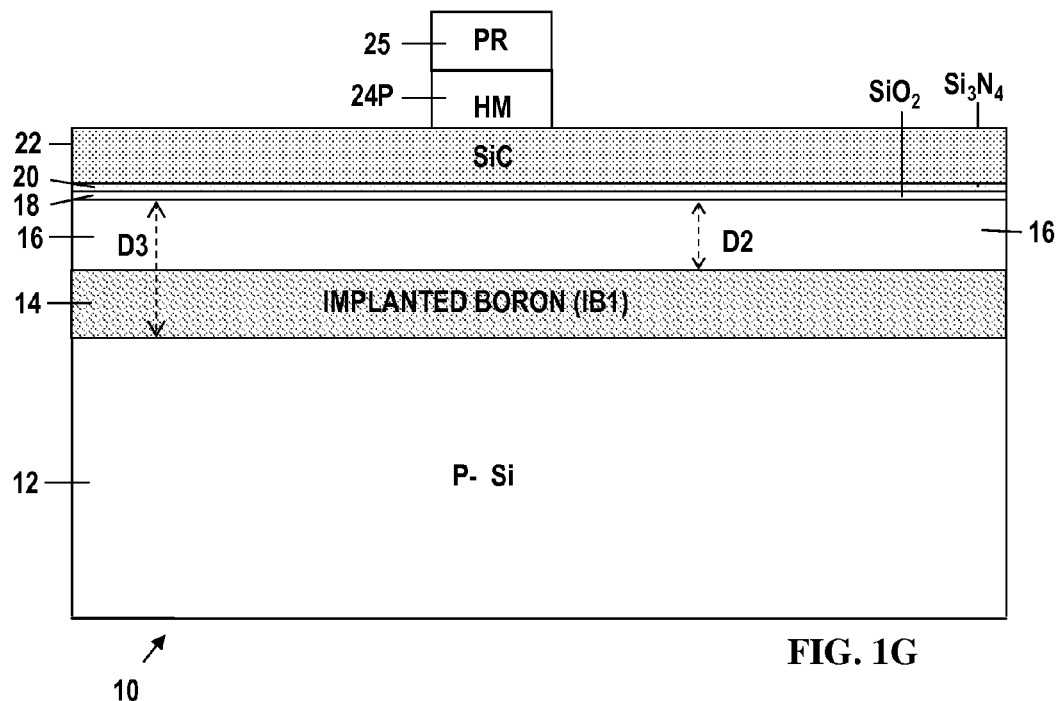

FIG. 1G shows the device 10 of FIG. 1F after step G of FIG. 3 of patterning the hard mask material layer 24 of FIG. 1F by first forming a narrow gate conductor (GC) mask 25 (that may be composed of photoresist) over the hard mask layer 24. The GC mask 25 has the width desired for a gate conductor GC, and in a subtractive process, the hard mask layer 24 is formed into the patterned hard mask 24P in the pattern of the GC mask 25.

Patterning of Sacrificial SiC Layer

Figure 1H:
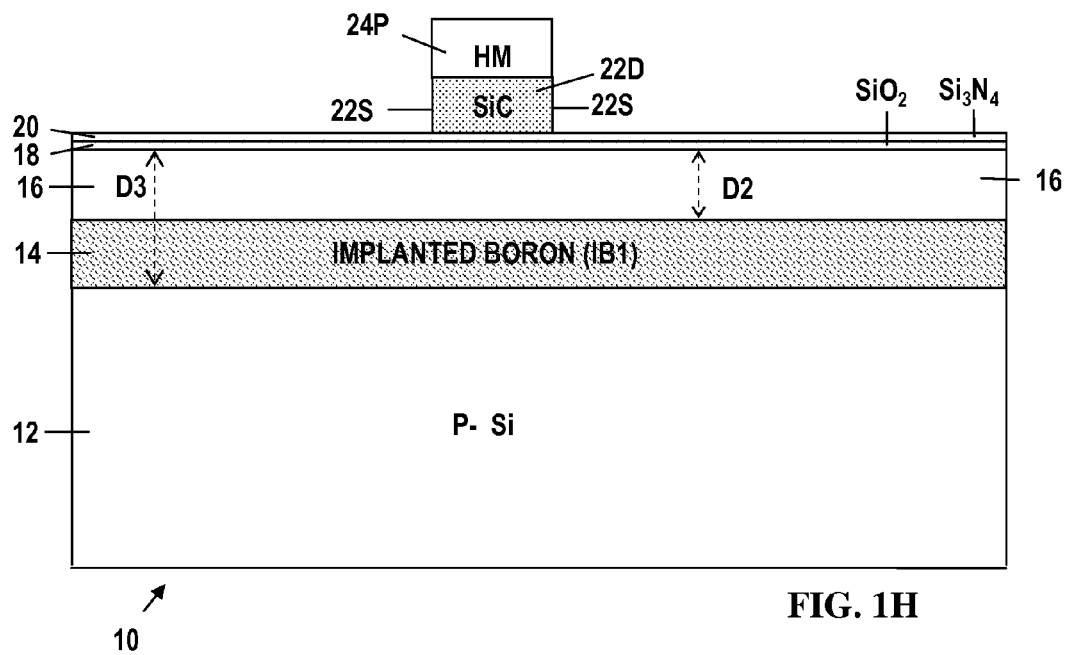
Figure 1I:
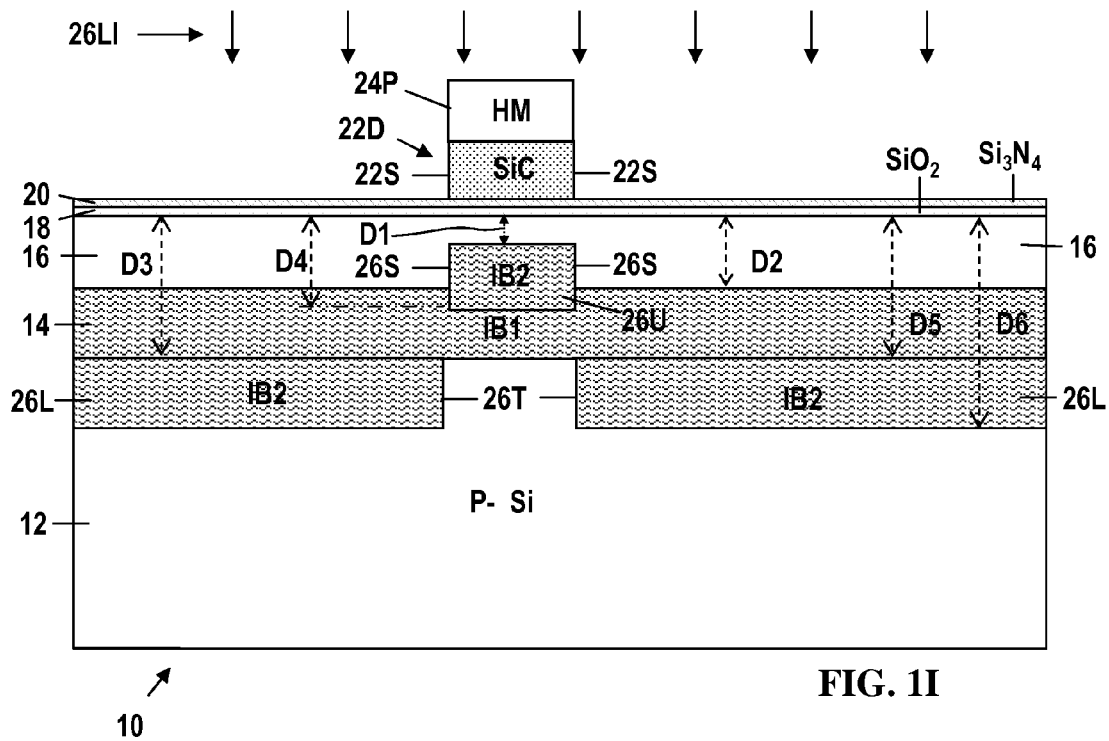

FIG. 1H shows the device 10 of FIG. 1G after performing step H of FIG. 3 of patterning the sacrificial SiC layer 22 into sacrificial SiC dummy gate 22D using patterned hard mask layer 24P as a mask for the RIE of the SiC selective to the underlying silicon nitride. Alternatively, photoresist can be used as a mask for the RIE of the SiC selective to the underlying silicon nitride.

Methods exist for the RIE of SiC selective to insulators, e.g. U.S. Pat. No. 6,670,278 of Li et al entitled "Method of Plasma Etching of Silicon Carbide." Basically, the SiC is patterned using a plasma formed by $CH_3F$ and an oxygen containing species. The resulting sacrificial SiC dummy gate 22D has vertical sidewalls 22S spaced apart by the desired width of the gate conductor GC that will be formed, as shown in FIG. 1T.

Second Boron Ions Implant Uppermost Below SiC Mask and Lower Elsewhere

FIG. 1I shows the device 10 of FIG. 1H after performing step I of FIG. 3 (following the formation of sacrificial SiC dummy gate 22D in step H) of forming P-doped, second, upper IB2 region 26U beneath the region of what has been formed as an Ultra Thin Channel (UTC) in the form of UTC region CH which is below the sacrificial SiC dummy gate 22D and the two lower IB2 regions 26L (which will be deep beneath the source and drain regions and the buried IB1 region 14) by performing a second implant with boron dopant ions 26I. The energy of the second boron implant is greater than that of the first, resulting in the implanted, second, upper and lower IB2 regions 26U/26L shown in FIG. 1H. Note that the upper IB2 region 26U extends down into the top surface of the buried IB1 region 14 so that the thickness from top to bottom of the upper IB2 region 26U and the bottom of the buried IB1 region 14 from depth D1 to D3 is less than the thickness from the top of the buried IB1 region 14 to the bottom of the lower IB2 regions 26U/26L from depth D2 to depth D6.

The top surface of the upper IB2 region 26U is located a depth D1 below the top surface of the thin semiconductor (Si) region 16 of the semiconductor (Si) substrate 12. The bottom surface of the upper IB2 region 26U is located a depth D4 below the top surface of the thin semiconductor region 16 of semiconductor substrate 12, which is greater than the depth D2 and less than the depth D3, extending partially down into the upper surface of the buried IB1 region 14. As shown in FIG. 1I, the combined thickness of the upper IB2 region 26U and the buried IB1 region 14 is less than the combined thickness of the buried IB1 region 14 lower IB2 region 26L.

The top surface of the lower IB2 region 26L is located a depth D5 (which is shown to be equal to depth D3 in this embodiment) below the top surface of the thin semiconductor region 16 of the semiconductor substrate 12. The bottom surface of the lower IB2 region 26L is located a depth D6 which is deeper than any of the depths D1, D2, D3, D4 or D5 below the top surface of the thin semiconductor region 16 of semiconductor substrate 12.

The upper IB2 region 26U is located centrally directly below the sacrificial SiC dummy gate electrode 22D extending, as stated above, partially down into the upper surface of the buried IB1 region 14. The implanted boron has passed through the thickness of the hard mask HM 24P and the sacrificial SiC dummy gate electrode 22D. The energy of the second boron implant is adjusted so that the location of the top surface of the upper IB2 region 26U can be controlled to obtain the desired thickness D1 of what will be transformed by step M in FIG. 3, as mentioned above into the UTC region CH of the semiconductor-on-insulator layer 16 of FIG. 1M under the gate region, which is to be formed in the location of the sacrificial SiC dummy gate electrode 22D. Referring again to FIG. 1I, the sidewalls 26S of the upper IB2 region 26U, which extend above the upper surface of buried IB1 region 14 are aligned with the sidewalls 22S of the SiC dummy gate electrode 22D.

The lower IB2 regions 26L are located laterally, below the buried IB1 region 14 aside from the sacrificial SiC dummy gate electrode 22D and the upper IB2 region 26U, and are shown located the depth D5 below the level of the buried IB1 region 14. The lower IB2 regions 26L, which are spaced apart by about the width of the sacrificial SiC dummy gate electrode 22D, have sidewalls 26T aligned with the sidewalls 26S of the sacrificial SiC dummy gate electrode 22D and the sidewalls 26S of the upper IB2 region 26U.

Stripping of Hard Mask

Figure 1J:
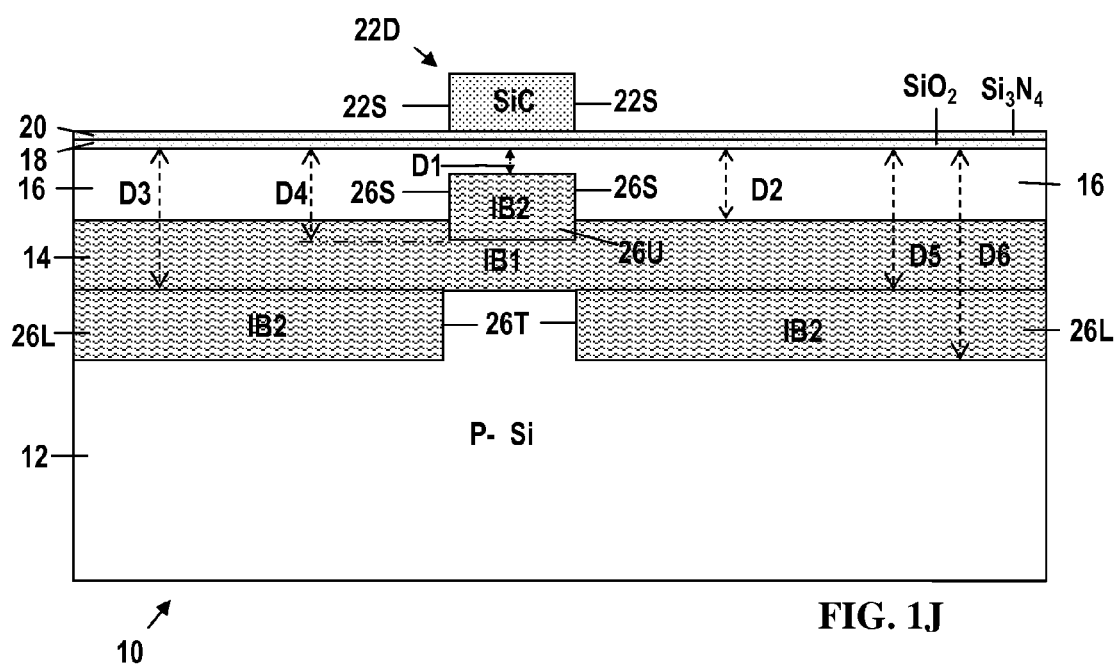

FIG. 1J shows the device 10 of FIG. 1I after performing step J of FIG. 3 in which the hard mask 22M (or resist mask) has been stripped by the process of isotropic etching and/or chemical stripping. If the hard mask 24P is composed of silicon oxide, a buffered HF etch is typically used. For a silicon nitride hard mask 24P, a RIE comprising $SF_6$ (sulfur hexafluoride) is preferred to avoid undercutting the silicon nitride layer 20 under the sacrificial SiC dummy gate 22D. In the case of a silicon nitride hard mask 24P, exposed regions of the silicon nitride layer 20 would also be removed. If the etch mask 24P for the sacrificial SiC dummy gate electrode 22D is composed of a resist material, an appropriate chemical resist stripper or an oxygen plasma could be used to strip the hard mask 24P.

Remove Exposed Portions of Nitride and Oxide

Figure 1K:
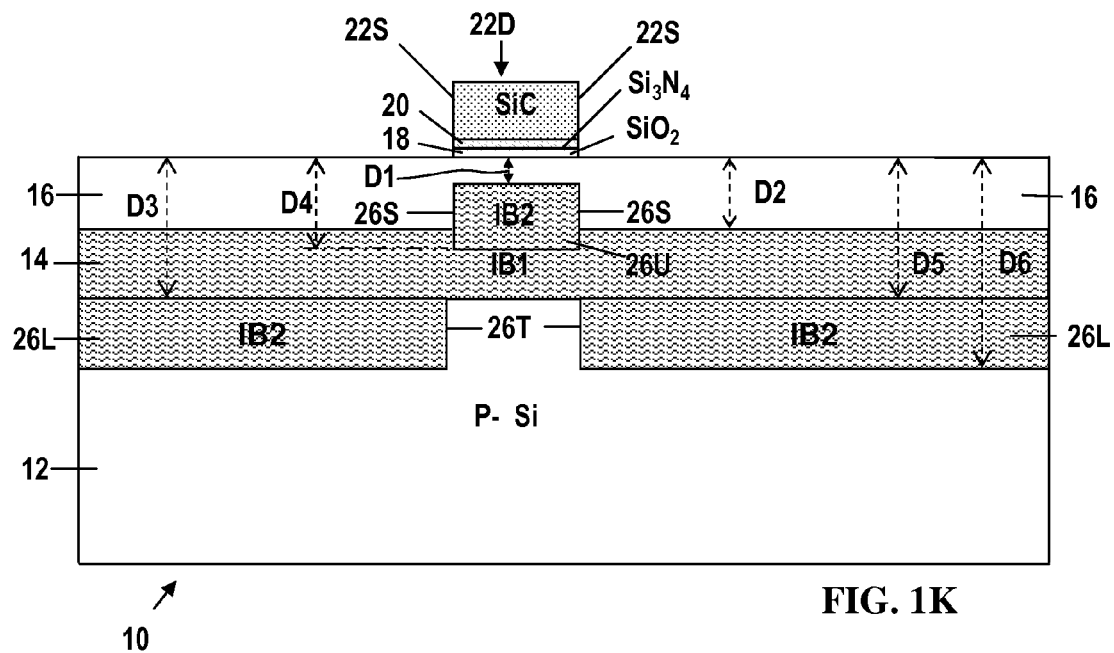

FIG. 1K shows the device 10 of FIG. 1J after performing step K of FIG. 3 in which the exposed portions of the thin silicon nitride layer 20 and the silicon oxide of the thin pad oxide layer 18 aside from the sacrificial SiC dummy gate electrode 22D have been removed by RIE (Reactive Ion Etching) as will be well understood by those skilled in the art. The RIE etching is selective to the sacrificial SiC dummy gate electrode 22D and the silicon layer 16. There are portions of the thin silicon nitride layer 20 and the thin pad oxide layer 18 which are protected from removal during this step, as they lie beneath the sacrificial SiC dummy gate electrode 22D.

Figure 1L:
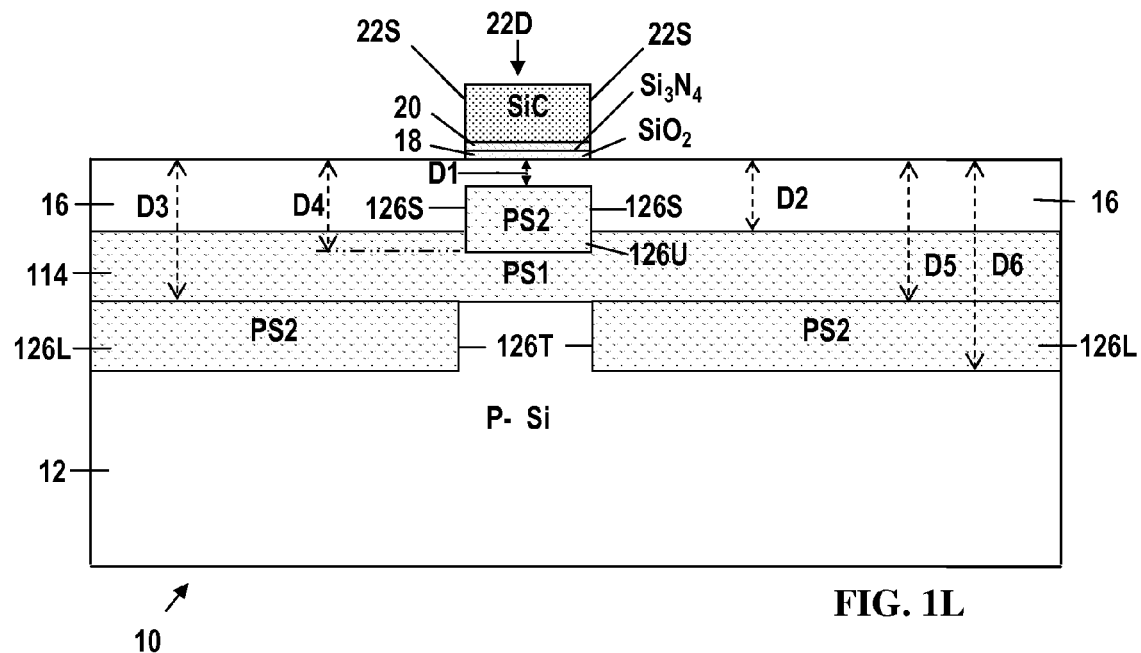
Figure 1M:
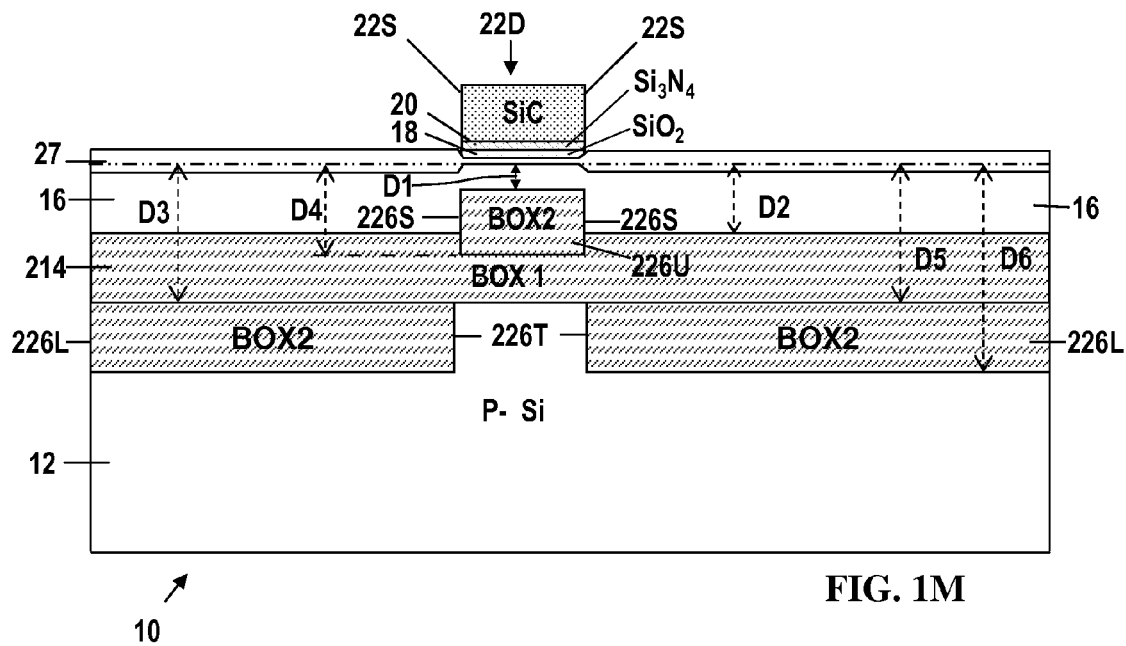

Anodize Semiconductor Substrate Converting Boron Implanted Regions into Porous Semiconductor Material FIG. 1L shows the device 10 of FIG. 1K after performing step L of FIG. 3 in which an anodization process has been applied to the semiconductor (Si) substrate 12. Then the semiconductor (Si) substrate 12 and a platinum electrode are placed in a bath of hydrogen fluoride (HF) solution with a positive terminal from a current source connected to the semiconductor substrate 12 and a negative terminal from a current source connected to the a platinum electrode. The HF solution, in the presence of the anodization current readily diffuses through the single crystal semiconductor (Si) to the higher concentration P-doped regions, where it reacts with the semiconductor material (Si) to form porous semiconductor (Si) regions PS1/PS2. A buried PS1 region 114 is formed from buried IB1 region 14. An upper porous semiconductor (S1) buried PS2 region 126U (with sidewalls 126S located in the position of former sidewalls 26S) is formed from upper IB2 region 26U. A pair of lower porous semiconductor (S1) buried PS2 regions 126L (with sidewalls 126T located in the position of former sidewalls 26T) are formed from lower IB2 regions 26L. The anodization current is in the range of 1 mA/cm$^2$ to 100 mA/cm2, depending on the desired porosity of the structure of the device 10. Then the process of formation of the porous regions in the semiconductor substrate 12 has been completed.

Perform InTernal OXidation to Convert of Porous Silicon Regions into BOX Regions Referring to FIG. 1M the device 10 of FIG. 1L is shown after it has been subjected in step M in FIG. 3 to an ITOX (InTernal OXidation of silicon) process at a temperature between about 800° C. and 1330° C. in an oxidizing ambient. During the ITOX process two things happen. First, a thin, thermally grown of silicon oxide layer 27 is formed in the surface of the thin upper semiconductor (Si) layer 16 (which has not been implanted with boron) aside from the sacrificial dummy gate electrode stack which is capped by the sacrificial SiC dummy gate electrode 22D, i.e. aside from the sidewalls 22S thereof.

In addition to formation of the thermally grown, thin silicon oxide layer 27, the porous semiconductor (Si) regions, which have been implanted with boron, are more readily oxidized to form several BOX regions 226U/226L. The porous semiconductor (Si) buried PS1 region 114 is converted into a BOX1 region 214 comprising a first boron implanted ITOX layer. The upper porous semiconductor (S1) buried PS2 region 126U is converted into a commensurate upper BOX2 region 226U, comprising a second boron implanted ITOX layer, located in the same position as PS2 region 126U extending partially down into the upper surface of the BOX1 region with sidewalls 226S located in the position of former sidewalls 126S aligned with the sidewalls 22S of the sacrificial SiC dummy gate electrode 22D. The pair of lower porous buried PS2 regions 126L are converted into a commensurate pair of lower BOX2 regions 226L, which have sidewalls 226T located in the position of former sidewalls 126T. Each of the silicon nitride layer 20 and the sacrificial SiC dummy gate electrode 22D are composed of a material which has a very high melting point. Thus, the silicon nitride layer 20 and the sacrificial SiC dummy gate electrode 22D do not degrade during the ITOX step.

Hydrogen Bake to Remove Most of the Implanted Boron from the Silicon

Figure 1N:
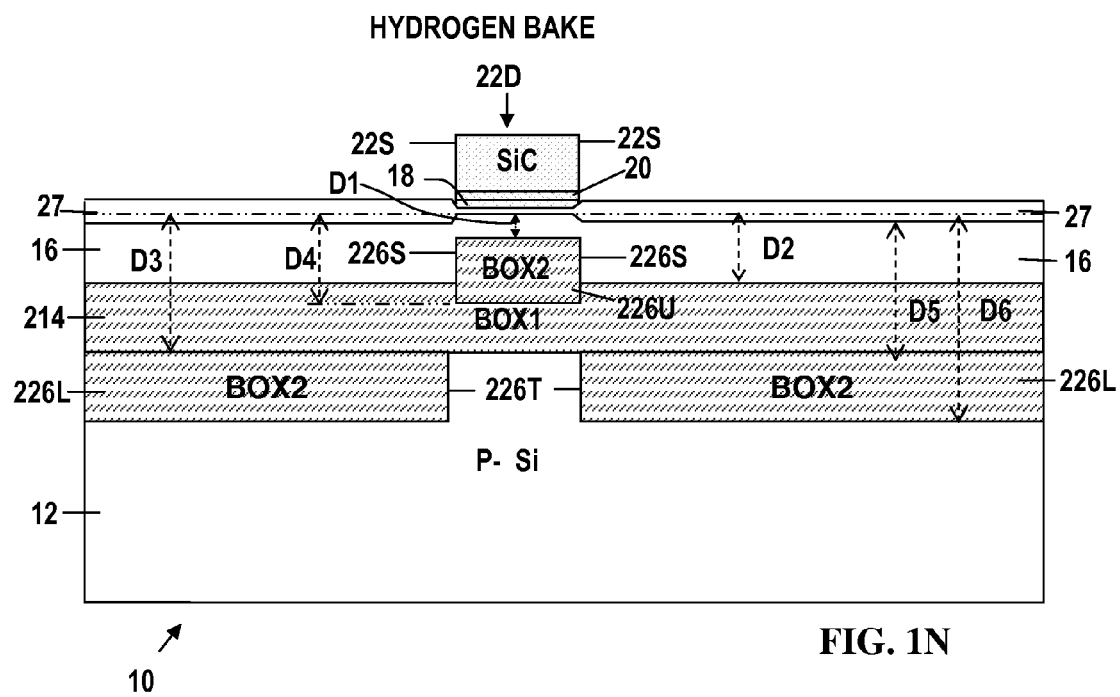

FIG. 1N shows the device 10 of FIG. 1M after performing step N of FIG. 3 in which the substrate 12 is subject to a hydrogen bake, which removes most of the implanted boron remaining in the silicon. The hydrogen bake is an important step since it provides sufficiently low doping concentration of boron to allow subsequent definition of device doping regions (e.g., UTC region, halos, source-drain). The hydrogen bake may be conducted at temperatures ranging from about 800° C. to 1,000° C. for times ranging from 30 seconds to 30 minutes.

Form Planarized, Gate Patterning Layer on Surface of Device

Figure 1O:
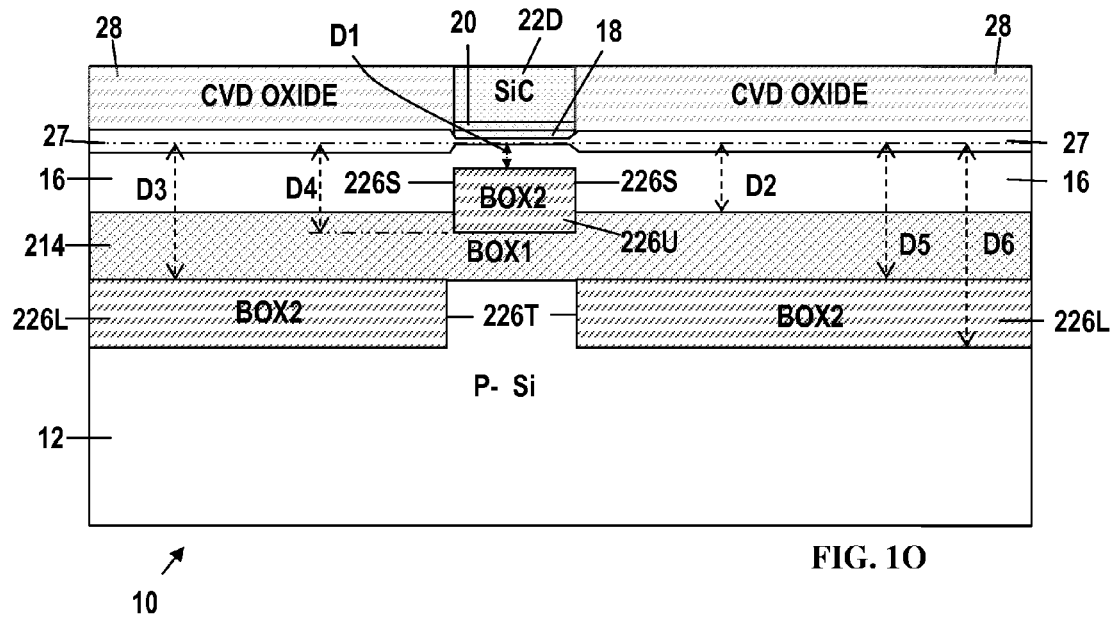

FIG. 1O shows the device 10 of FIG. 1N after step O in which a gate patterning layer 28, preferably composed of silicon oxide layer is formed by Chemical Vapor Deposition (CVD) and planarized to the level of the top surface of the sacrificial SiC dummy gate electrode 22D.

Remove Sacrificial SiC Pattern from Device to Form Gate Electrode Aperture

Figure 1P:
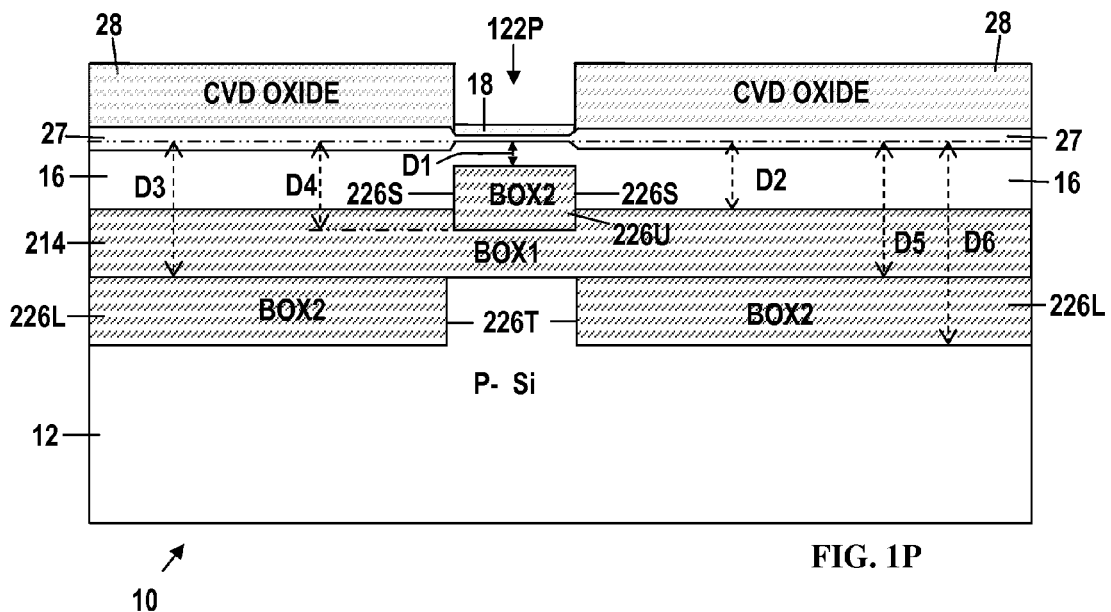

FIG. 1P shows the device 10 of FIG. 1O after step P in which the sacrificial SiC dummy gate 22D has been removed by etching with an etchant selective to the gate patterning, silicon oxide layer 28 followed by etching away the remainder of the silicon nitride layer 20 which had been protected during step 40 by being located below the sacrificial SiC dummy gate electrode 22D exposing the thin pad oxide layer 18 therebelow. Methods for plasma etching SiC selective to oxide and nitride have been disclosed by Li et al in U.S. Pat. No. 6,670,278 and are incorporated herein by reference. The removal of the sacrificial SiC dummy gate electrode 22D and the silicon nitride layer 20 leaves a recess in the gate patterning, silicon oxide layer 28 for use as a gate electrode patterning aperture 122P reaching down to the top surface of the thin pad oxide layer 18.

Perform Ultra Thin Channel (UTC) Implant Through Gate Electrode Aperture

Figure 1Q:
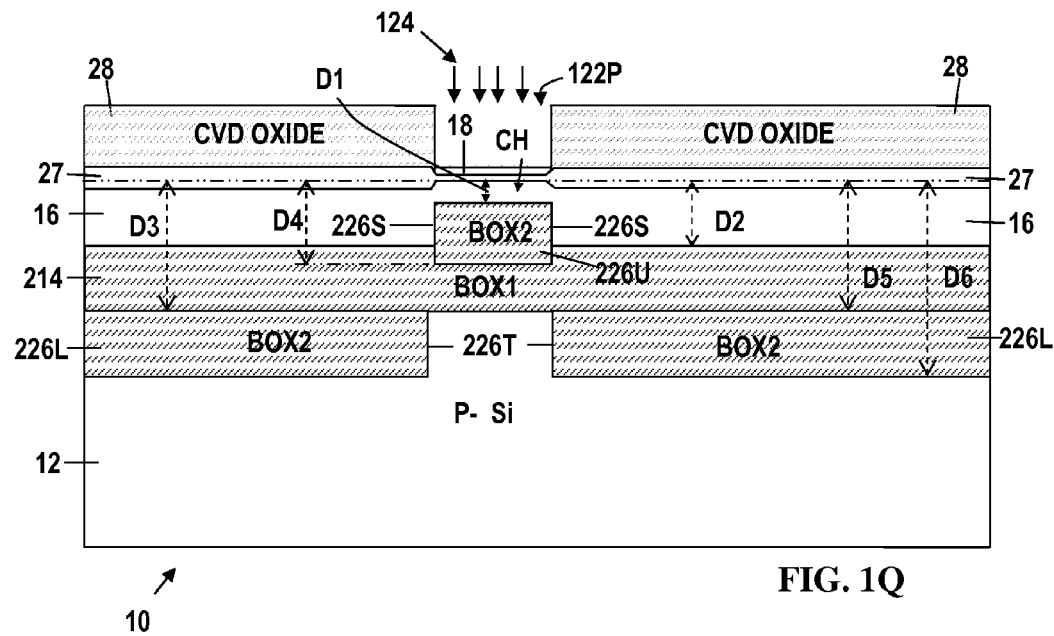

FIG. 1Q shows the device 10 of FIG. 1P during step Q of FIG. 3 when UTC region implant ions 124 are being implanted through the recess or aperture 122P and through the thin pad oxide layer 18 at the base thereof into the thin upper semiconductor layer 16 to form a UTC region CH in the portion of the thin upper semiconductor layer 16 adjacent to aperture 122A and extending down alongside the sidewalls 226S of the upper BOX2 region 226U. The UTC region regions CH extends to a depth D1 below the top surface of the upper semiconductor layer 16, which is the upper surface of the substrate of device 10.

Remove Pad Oxide Layer from Gate Electrode Aperture

Figure 1R:
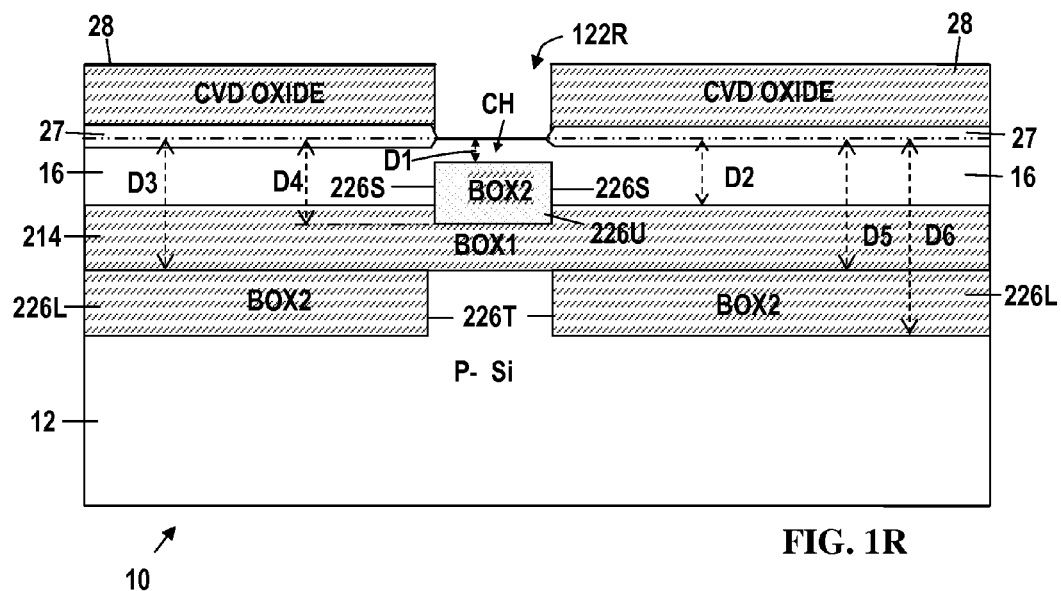

FIG. 1R shows the device 10 of FIG. 1Q after step R of FIG. 3 during which the exposed thin pad oxide layer 18 at the bottom of the aperture 112P was removed forming a deepened recess or aperture 122P extending down to the surface of the thin upper semiconductor layer 16 where the UTC region CH is formed.

Form Gate Dielectric Layer over the Exposed UTC Region

Figure 1S:
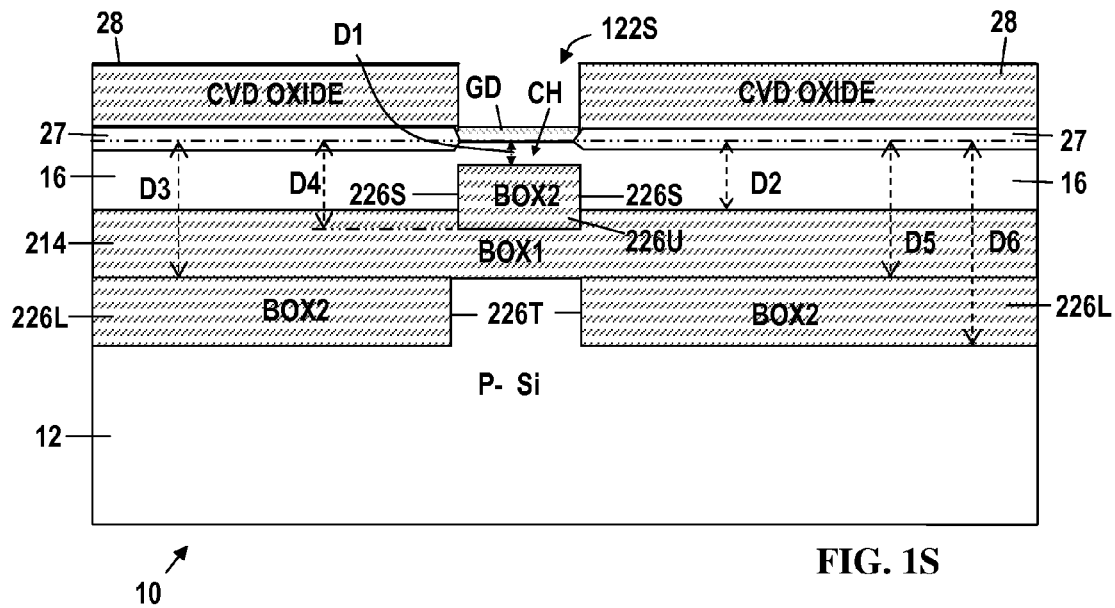
Figure 1T:
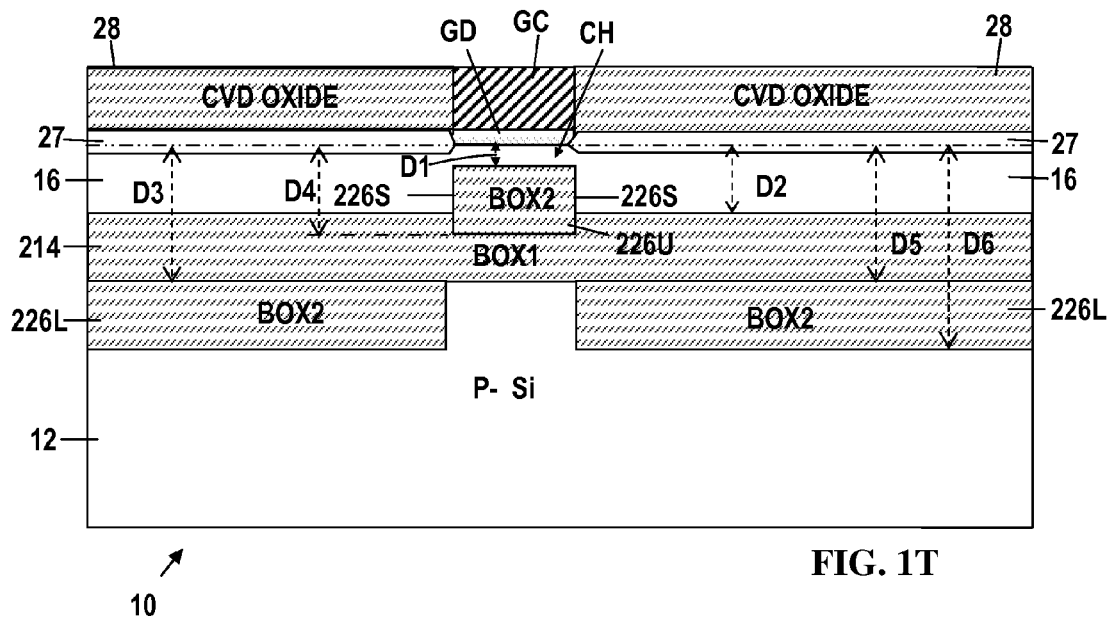

FIG. 1S shows the device 10 of FIG. 1R after step S of FIG. 3 during which a gate dielectric layer GD was formed on top of the UTC region CH (i.e. on top of the upper thin silicon layer 16) at the base of the gate patterning aperture 122R forming a shallower recess or gate patterning aperture 122S in the gate patterning, silicon oxide layer 28. The gate dielectric layer GD may comprise a material selected from the group consisting of silicon oxide, silicon oxynitride, and high-K dielectric or a combination thereof.

Deposit Gate Conductor into Gate Aperture over Gate Dielectric

FIG. 1T shows the device 10 of FIG. 1S after step T of FIG. 3 during which a gate conductor GC was deposited, on the gate dielectric layer GD filling the recess or gate patterning aperture 122S. The gate conductor GC, which has been planarized to the top surface of the CVD oxide layer 28, may be composed of a material selected from the group consisting of a metal (e.g. tungsten), a silicide (e.g. tungsten or nickel silicide), and doped polysilicon, or a combination thereof.

Strip Gate Patterning Layer

Figure 1U:
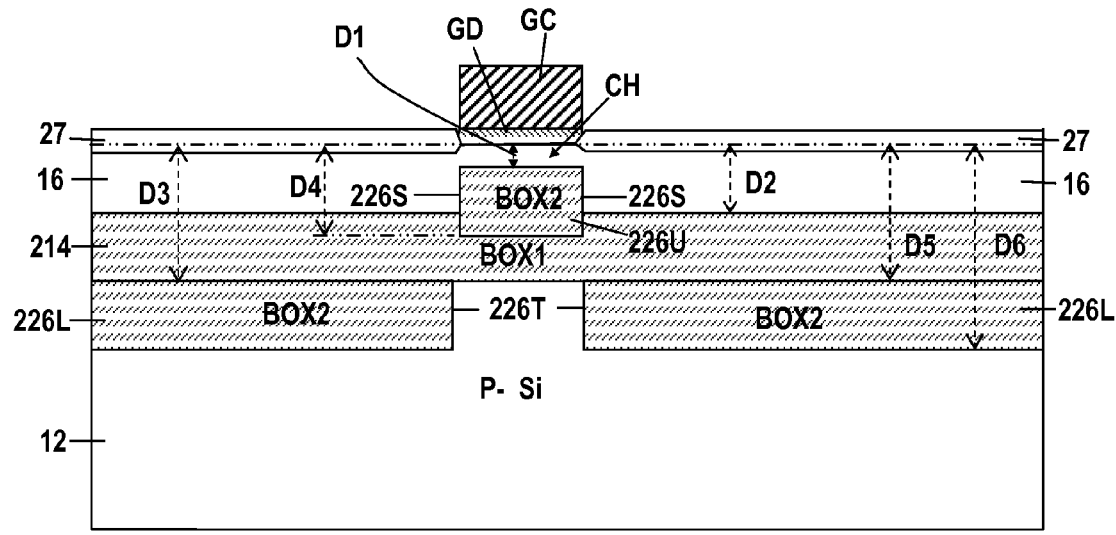

In step U of FIG. 3, as shown by FIG. 1U, the CVD oxide layer 28 of FIG. 1T has been removed selective to the gate conductor GC, which remains. Preferably an HF solution is used as the etchant, as it etches the CVD oxide layer 28 many times faster than the thermally grown oxide layer 27 therebelow. A substantial portion of the underlying thin silicon oxide layer 27 may remain after this step of oxide etching, because its density is greater than that of the CVD oxide layer 28. It is preferable to use a directional etch (e.g. RIE) towards the end of this etch process to avoid the undercutting of the gate conductor GC and etching into the gate dielectric GD. Optionally, the thin silicon oxide layer 27 may be completely removed by continued etching. A screen oxide would then be grown on the surface of region 16, prior to source-drain implants.

Form Source/Drain Extensions

Figure 1V:
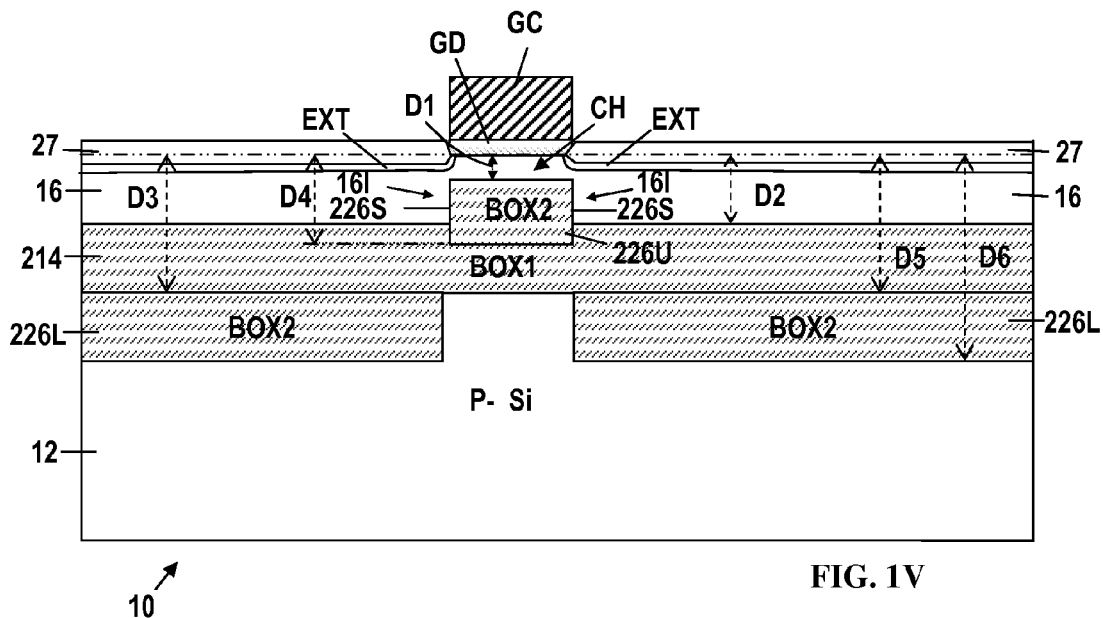

In step V of FIG. 3, as shown by FIG. 1V, source-drain extension implants 16I (EXT) and halos (not shown for convenience of illustration) are added at this time into the device 10 of FIG. 1U. The first BOX1 region 214 extends across beneath the gate conductor GC, the UTC region CH and the future locations of source and drains regions 216 shown in FIG. 1W. The upper surface of the first BOX1 region 214 is spaced by the depth D2 below the top surface of the substrate and extends down to the depth D3 therebelow. The upper portion 226U of the second BOX2 region formed in the substrate 12 is positioned under the UTC region CH and is self-aligned with and is laterally coextensive with said gate conductor GC. In addition, the second BOX2 extends vertically down from the depth D1 to the depth D4 below the top surface of the substrate 12. The depth D3 is greater than the depth D2, which is greater than the depth D1. The lower portion 226L of the second BOX2 regions under the source-drain regions 216 is self-aligned to the gate conductor GC as well as the UTC region CH, and extends vertically from a fifth depth to a sixth depth below the top surface of the substrate 12. The sixth depth is greater than either of the depth D3 and the depth D5 The depth D5 is greater than said depth D4. The depth D3 and the fifth depth are both greater than the depth D4.

Form Sidewall Spacers and Perform S/D Implantation

Figure 1W:
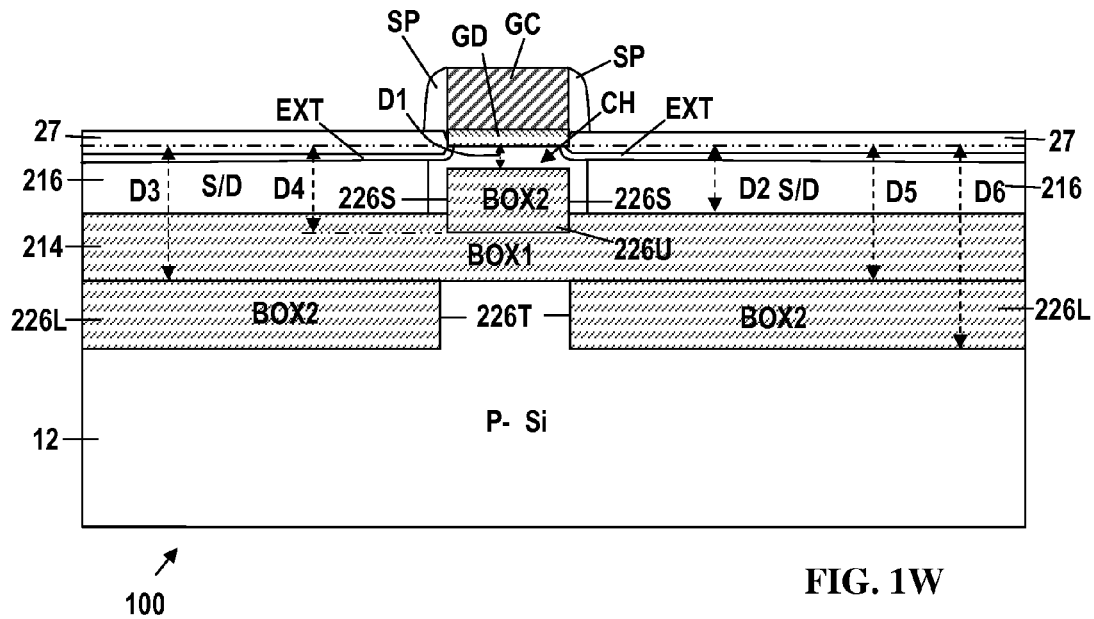

In step W of FIG. 3, as shown by FIG. 1W, sidewall spacers SP are formed on the sidewalls of the gate conductor GC of FIG. 1V. Typically, the sidewall spacers SP are composed of silicon oxide or silicon nitride, which is formed by well known deposition and RIE methods. Then a conventional step is performed of source-drain S/D implantation to form source/drain regions 216 that have inner edges which are self-aligned with the spacers SP aside from the gate conductor GC. Note that the source/drain regions 216 extend well below the UTC region CH which is formed above the upper BOX2 region 226U, i.e. the source/drain regions reach down to the BOX1 region 214, which has an upper surface at the depth D2, that is substantially lower than the top surface of the upper BOX2 region 226U at a depth of D1. In short, the source/drain regions 216 extend to a depth D2, which is greater than the depth D1 below the top surface of the upper silicon layer 16. As shown in FIG. 1W, the combined thickness of the upper BOX2 region 226U the buried BOX1 region 214 is less than the combined thickness of the buried BOX1 region 214 and the lower BOX2 region 226L. This is true because the upper BOX2 region 226U extends well down into the top surface of the BOX1 region 214. Accordingly, the thickness of the combined BOX 1 and BOX2 layers under the gate conductor GC is less than the thickness of the combined BOX 1 and BOX2 layers under both the source/drain S/D regions 216. The BOX 1 layer 214 plus the upper BOX2 layer 226U and the lower BOX2 layers 226L combine to form a Variable Thickness Buried OXide (VTBOX) layer. above the substrate 12.

Various depths of the edges of the buried BOX2 regions 226U/226L and 121 in the device 10 are summarized next. The upper edge (top surface) of BOX2 region 226U is a depth D1 below the top surface of the thin semiconductor region 16 of semiconductor substrate 12 of FIGS. 1D-1V. The upper edge (top surface) of BOX1 region 214 is a depth D2 below the top surface of thin semiconductor region 16 of semiconductor substrate 12. The lower edge (bottom surface) of the BOX1 region 214 is a depth D3 below the top surface of thin semiconductor region 16 of semiconductor substrate 12. The lower edge (bottom surface) of BOX2 region 226U is a depth D4 below the top surface of the thin semiconductor region 16 of the semiconductor substrate 12. The upper edge (top surface) of BOX2 region 226L is a depth D5 below the top surface of thin semiconductor region 16 of semiconductor substrate 12. The lower edge (bottom surface) of BOX2 region 226S is a depth D6 below the top surface of the thin semiconductor region 16 of semiconductor substrate 12. While the depths D1-D6 may vary as a function of processing, to avoid prolixity and confusion, while the depths are assumed to be substantially the same as shown in FIG. 1W. Note that in FIG. 2, unlike FIG. 1W, the depth D3 of the BOX1 region 214 is shown to be greater than the depth D5' of the top of the lower BOX2 regions 226L'. In any event, the thickness under the UTC region CH of the combined upper BOX2 region 226U and the buried BOX1 region 214 is less than the combined thicknesses of the buried BOX1 region 214 lower BOX2 region 226L under the source/drain S/D regions in layers 214 and 216. The FIG. 1W structure has the advantages that the BOX under the UTC region is thinner and the BOX under the source/drain regions is thick so that the thin BOX under the UTC region (i.e. the UTC) suppresses fringing whereas the thick BOX under the source/drain (S/D) regions reduces junction capacitance thereby avoiding the problem of slowing down device speed.

While in FIGS. 1I to 1W the dimensions D3 and D5 appear in the schematic drawings to be equal, that is not necessarily the case in a practical embodiment. However, it is preferred that D5 shall not exceed D3 and D3 must be more than D2. Preferably, D3 is greater than D4. The important factor is that D1 is substantially less than D2 so that the source/drain regions S/D are deeper in the ultra thin semiconductor region 16 than the UTC region CH. Thus the combined thicknesses of the BOX regions under the UTC region are less than the combined thicknesses of the BOX regions under the source/drain regions S/D. The depth D6 is greater than the depth D3. The depth D5 is greater than the depth D3. The depth D4 is greater than the depth D2 so that the upper second BOX2 region extends partially down into The BOX1 region. The depth D3 is greater than the depth D2. The depth D2 is greater than the depth D1 with combined thicknesses of the BOX1 and the upper BOX2 regions under the UTC region being less than combined thicknesses of the BOX1 and the lower BOX2 regions under the source/drain regions. The thickness of BOX1 layer plus the BOX2 layer under the gate conductor is less, i.e. thinner, than the thickness of the BOX1 layer plus the BOX2 layer under the source/drain regions. In addition the BOX1 and BOX2 regions are boron implanted and anodized ITOX (InTernal OXide) regions. The boron implanted and anodized ITOX regions comprise structures the characteristic of which are detectable with test equipment. The embodiment of FIG. 1W has the advantages that the BOX under the UTC region is thinner and the BOX under the source/drain regions is thick. The thin BOX under the UTC region suppresses fringing. An additional advantage is that the thick BOX under the source/drain (S/D) regions reduces junction capacitance thereby avoiding the problem of slowing down device speed.

Conventional processing continues from this point, which includes formation of interlevel dielectric layers, conductive studs, and wiring levels. The process ends with step X of FIG. 3. Note that the steps A-X of FIG. 3 are described above in combination with the description of FIGS. 1A-1W.

UTC SOI MOSFET Embodiment

Figure 2:
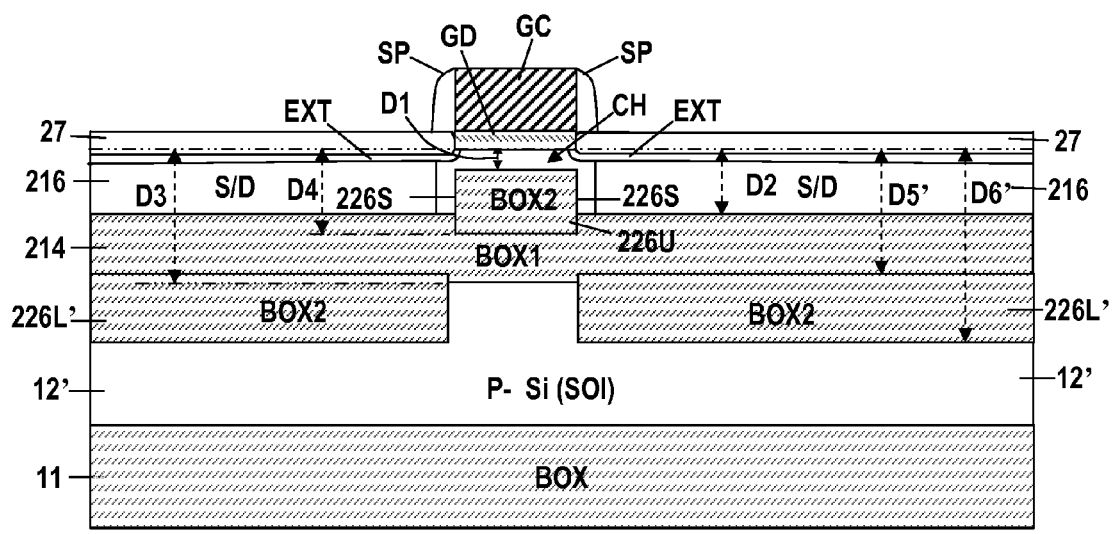
FIG. 2 is a modification of the device of FIG. 1W in which the device is formed on a semiconductor-on-insulator base instead of a bulk silicon semiconductor substrate with a modification of the depth of the lower region of the second BOX2 structure.

FIG. 2 shows a second embodiment of this invention comprising a device 100 which is similar to the device 10 of FIG. 1W, but which has been modified by the formation of the structure on a BOX substrate 11 above which and SOI layer 12' is formed as compared with the bulk substrate 12 of FIGS. 1A-1W. In addition, the lower BOX2 regions 226L are shown overlapping the BOX1 region 214 so that the depth D5 of the top surface of the lower BOX2 regions 226L is less than the depth D3 of the bottom surface of the BOX1 region 214. The device 100 can be manufactured in accordance with the steps shown in FIG. 3. The BOX 1 layer 214 plus the upper BOX2 layer 226U and the lower BOX2 layers 226L' combine to form a Variable Thickness Buried OXide (VTBOX) layer. above the SOI layer 12'. D6' is less than D6 and D5' is less than D5 so that the thickness under the S/D regions 216 is different, but the thicknesses can be chosen to satisfy design requirements by designing the thicknesses under the UTC vs. under the S/D regions 216 of the VTBOX layer to satisfy capacitance and to suppress fringing.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the following claims.

Having thus described the invention, what is claimed as new and desirable to be secured by Letters Patent is as follows:

1. An FET device comprising:
a gate electrode stack formed over a top surface of a SEMIconductor-On-Insulator (SEMOI) layer having variable thicknesses below said gate electrode stack and aside therefrom;
an Ultra Thin Channel (UTC) region formed below said gate electrode stack in said SEMOI layer with source and drain regions formed in said SEMOI layer aside from said gate electrode stack and said UTC region; and
a Variable Thickness Buried OXide (VTBOX) layer formed under all of said UTC region and under said source and drain regions with said VTBOX layer being thinner under said UTC region than under said source and drain regions.

2. The device of claim 1 wherein said top surface of said SEMOI layer is planar and substantially coplanar with top surfaces of said UTC region and said source and drain regions.

3. The FET device of claim 1 wherein:
spacers formed on sidewalls of said gate electrode stack;
said VTBOX layer including a first Buried Oxide (BOX1) region and second Buried Oxide (BOX2) regions including an upper BOX2 region under said UTC region and lower BOX2 regions aside from said gate electrode stack;
said upper BOX2 region being directly below said UTC region and aligned with sidewalls of said gate electrode stack;
said lower BOX2 regions being lower than said BOX1 region aside from said gate electrode stack with source drain regions formed in said SEMOI layer thereabove; and
said UTC region being aligned with outer surfaces of said sidewall spacers.

4. The FET device of claim 1 wherein said top surface of said SEMOI layer is substantially coplanar with upper surface of said UTC region.

5. The FET device of claim 1 wherein:
said source and said drain regions are embedded in said semiconductor substrate above said BOX1 region; and
inner edges of said source and drain regions are self-aligned with outer edges of sidewall spacers formed on sidewalls of said gate electrode conductor.

6. The FET device of claim 1 wherein a surface insulating layer is formed on said top surface of said SEMOI layer aside from said gate electrode conductor.

7. The FET device of claim 6 wherein source/drain extensions are formed beneath said surface insulating layer aside from said gate dielectric.

8. The FET device of claim 3 wherein:
said UTC extends from said top surface of said SEMOI layer to a UTC bottom surface a depth D1 below said top surface;
said BOX1 region extending laterally across said device, and extending vertically from a depth D2 to a depth D3 below said top surface of said SEMOI layer;
where said depth D3 is greater than both said depth D1 and said depth D2;
said upper BOX2 region extending vertically from said depth D1 to a depth D4 below said top surface of said SEMOI layer with said depth D4 being greater than said depth D2; and
said lower BOX2 regions extending vertically from a depth D5 below said top surface of said SEMOI layer to a depth D6 below said top surface of said SEMOI layer with said depth D5 being less than said depth D6.

9. An FET device comprising:
a gate electrode stack comprising and a gate electrode conductor formed on a gate dielectric which in turn is atop a top surface of a SEMIconductor-On-Insulator (SEMOI) layer having variable thicknesses below said gate electrode stack and aside therefrom above a semiconductor substrate; an Ultra Thin Channel (UTC) region located in said SEMOI layer directly below said gate electrode conductor and said gate dielectric;
a first Buried Oxide (BOX1) region in said semiconductor substrate defining a BOX1 upper surface and a BOX1 lower surface;

a source region and a drain region juxtaposed with said UTC region formed in said SEMOI layer above said first BOX1 region;

a set of second Buried Oxide (BOX2) regions formed in said semiconductor substrate directly below said gate electrode conductor and said UTC region;

an upper BOX2 region having a top surface formed above said BOX1 region and aligned with said gate electrode conductor;

a pair of lower BOX2 regions formed aside from said channel located below said first BOX1 region and having inner edges aligned with outer edges of said gate electrode conductor; and with combined thicknesses of said BOX1 and said upper BOX2 regions under said channel region being different from combined thicknesses of said BOX1 and said lower BOX2 regions under said source/drain regions.

10. The method of forming an FET device of claim 9 wherein said substrate comprises a Silicon on Insulator (SOI) layer formed over a Lower Buried OXide (LBOX) layer;
said BOX1 region being formed over said LBOX layer and said lower BOX2 regions being formed in said SOI layer.

11. A method of forming an FET device comprising:
forming a gate electrode stack over a top surface of a SEMIconductor-On-Insulator (SEMOI) layer having variable thicknesses below said gate electrode stack and aside therefrom;

forming an Ultra Thin Channel (UTC) region below said gate electrode stack in said SEMOI layer with source and drain regions formed in said SEMOI layer aside from said gate electrode stack and said UTC; and forming a Variable Thickness Buried OXide (VTBOX) layer having variable thickness formed under all of said UTC region and under said source and drain regions with said VTBOX layer being thinner under said UTC region than under said source region and said drain region.

12. The method of claim 11 of forming an FET device wherein said top surface of said SEMOI layer is planar and substantially coplanar with top surfaces of said UTC region and said source and drain regions.

13. The method of claim 11 of forming an FET device including:
forming spacers on sidewalls of said gate electrode stack;
forming said VTBOX layer including a first Buried Oxide (BOX1) region and second Buried Oxide (BOX2) regions including an upper BOX2 region under said UTC region and lower BOX2 regions aside from said gate electrode stack;
forming said upper BOX2 region directly below said UTC region and aligned with sidewalls of said gate electrode stack;
forming said lower BOX2 regions lower than said BOX1 region aside from said gate electrode stack with source drain regions formed in said SEMOI layer thereabove; and
forming said UTC region aligned with outer surfaces of said sidewall spacers.

14. The method of claim 11 of forming an FET device wherein said top surface of said SEMOI layer is substantially coplanar with upper surface of said UTC region.

15. The method of claim 11 including:
forming said source and said drain regions are embedded in said semiconductor substrate above said BOX1 region; and forming inner edges of said source and drain regions are self-aligned with outer edges of sidewall spacers formed on sidewalls of said gate electrode conductor.

16. The method of claim 11 wherein a surface insulating layer is formed on said top surface of said SEMOI layer aside from said gate electrode conductor.

17. The method of claim 16 wherein source/drain extensions are formed beneath said surface insulating layer aside from said gate dielectric.

18. The method of claim 13 including:
forming said UTC extends from said top surface of said SEMOI layer to a UTC bottom surface a depth D1 below said top surface;
forming said BOX1 region extending laterally across said device, and extending vertically from a depth D2 to a depth D3 below said top surface of said SEMOI layer, where said depth D3 is greater than both said depth D1 and said depth D2;
forming said upper BOX2 region extending vertically from said depth D1 to a depth D4 below said top surface of said SEMOI layer with said depth D4 being greater than said depth D2; and
forming said lower BOX2 regions extending vertically from a depth D5 below said top surface of said SEMOI layer to a depth D6 below said top surface of said SEMOI layer with said depth D5 being less than said depth D6.

19. A method of forming an FET device comprising:
forming a gate electrode stack comprising and a gate electrode conductor formed on a gate dielectric which in turn is formed on a top surface of a SEMIconductor-On-Insulator (SEMOI) layer having variable thicknesses below said gate electrode stack and aside therefrom above a semiconductor substrate;

forming an Ultra Thin Channel (UTC) region located in said SEMOI layer directly below said gate electrode conductor and said gate dielectric;

forming a first Buried Oxide (BOX1) region in said semiconductor substrate defining a BOX1 upper surface and a BOX1 lower surface;

forming a source region and a drain region juxtaposed with said UTC region formed in said SEMOI layer above said first BOX1 region;

forming a set of second Buried Oxide (BOX2) regions in said semiconductor substrate directly below said gate electrode conductor and said UTC region;

forming an upper BOX2 region having a top surface formed above said BOX1 region and aligned with said gate electrode conductor;

forming a pair of lower BOX2 regions formed aside from said channel located below said first BOX1 region and having inner edges aligned with outer edges of said gate electrode conductor; and forming said device with combined thicknesses of said BOX1 and said upper BOX2 regions under said channel region being different from combined thicknesses of said BOX1 and said lower BOX2 regions under said source/drain regions.

20. The FET device of claim 19 wherein said substrate comprises a Silicon on Insulator (SOI) layer formed over a Lower Buried OXide (LBOX) layer;
said BOX1 region being formed over said LBOX layer and said lower BOX2 regions being formed in said SOI layer.

* * * * *

UNITED STATES PATENT AND TRADEMARK OFFICE
CERTIFICATE OF CORRECTION

| | | |
|---|---|---|
| PATENT NO. | : 7,812,397 B2 | Page 1 of 1 |
| APPLICATION NO. | : 12/166285 | |
| DATED | : October 12, 2010 | |
| INVENTOR(S) | : Kangguo Cheng et al. | |

It is certified that error appears in the above-identified patent and that said Letters Patent is hereby corrected as shown below:

On the title page

Inventor Changguo Cheng should appear as KANGGUO CHENG

Signed and Sealed this
Fourteenth Day of April, 2015

Michelle K. Lee
*Director of the United States Patent and Trademark Office*